US008274083B2

(12) United States Patent
Kadono et al.

(10) Patent No.: US 8,274,083 B2
(45) Date of Patent: Sep. 25, 2012

(54) SEMICONDUCTOR DEVICE AND A METHOD OF MANUFACTURING THE SAME

(75) Inventors: Masaya Kadono, Kanagawa (JP); Shunpei Yamazaki, Tokyo (JP); Yukio Yamauchi, Shizuoka (JP); Hidehito Kitakado, Hyogo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/005,728

(22) Filed: Jan. 13, 2011

(65) Prior Publication Data

US 2011/0101367 A1    May 5, 2011

Related U.S. Application Data

(60) Division of application No. 12/174,124, filed on Jul. 16, 2008, now Pat. No. 7,871,936, which is a continuation of application No. 09/535,233, filed on Mar. 24, 2000, now Pat. No. 7,402,467.

(30) Foreign Application Priority Data

Mar. 26, 1999  (JP) .................................. 11-084989

(51) Int. Cl.
*H01L 29/00* (2006.01)
*H01L 31/036* (2006.01)

(52) U.S. Cl. .................. 257/65; 257/E33.043
(58) Field of Classification Search .......... 257/58, 257/62, 65, 665, E33.043
See application file for complete search history.

(56) References Cited

U.S. PATENT DOCUMENTS

| | | | | |
|---|---|---|---|---|
| 3,426,422 A | * | 2/1969 | Deal | 438/106 |
| 3,514,676 A | * | 5/1970 | Fa | 257/351 |
| 4,339,340 A | | 7/1982 | Muraoka et al. | |
| 5,032,217 A | | 7/1991 | Tanaka | |
| 5,102,813 A | | 4/1992 | Kobayashi et al. | |
| 5,391,893 A | | 2/1995 | Yamazaki | |
| 5,418,173 A | * | 5/1995 | Lee et al. | 438/476 |
| 5,476,816 A | | 12/1995 | Mautz et al. | |
| 5,487,398 A | | 1/1996 | Ohmi et al. | |
| 5,498,974 A | * | 3/1996 | Verkuil et al. | 324/750.02 |
| 5,521,400 A | | 5/1996 | Yamazaki | |
| 5,529,937 A | | 6/1996 | Zhang et al. | |
| 5,543,635 A | * | 8/1996 | Nguyen et al. | 257/66 |
| 5,556,794 A | * | 9/1996 | Yamazaki | 438/482 |
| 5,578,103 A | | 11/1996 | Araujo et al. | |

(Continued)

FOREIGN PATENT DOCUMENTS

JP    4-92472 A    3/1992

(Continued)

OTHER PUBLICATIONS

Santos Mayo et al., "Development of Sodium Contamination in Semiconductor Oxidation Atmospheres at 1000 degrees C", Electro Chemical Society, vol. 124, No. 5, pp. 780-785, 1977.*

(Continued)

*Primary Examiner* — William D Coleman
(74) *Attorney, Agent, or Firm* — Husch Blackwell LLP

(57) ABSTRACT

A reduction in contaminating impurities in a TFT, and a TFT which is reliable, is obtained in a semiconductor device which uses the TFT. By removing contaminating impurities residing in a film interface of the TFT using a solution containing fluorine, a reliable TFT can be obtained.

24 Claims, 17 Drawing Sheets

U.S. PATENT DOCUMENTS

| | | | |
|---|---|---|---|
| 5,583,369 A * | 12/1996 | Yamazaki et al. | 257/635 |
| 5,637,870 A * | 6/1997 | Tanigaki | 850/18 |
| 5,658,615 A | 8/1997 | Hasebe et al. | |
| 5,693,541 A | 12/1997 | Yamazaki et al. | |
| 5,698,869 A | 12/1997 | Yoshimi et al. | |
| 5,783,495 A | 7/1998 | Li et al. | |
| 5,792,327 A | 8/1998 | Belscher et al. | |
| 5,953,595 A * | 9/1999 | Gosain et al. | 438/158 |
| 5,985,700 A | 11/1999 | Moore | |
| 6,025,630 A | 2/2000 | Yamazaki et al. | |
| 6,106,907 A | 8/2000 | Yoshikawa et al. | |
| 6,123,865 A | 9/2000 | Lin et al. | |
| 6,127,279 A | 10/2000 | Konuma | |
| 6,208,071 B1 * | 3/2001 | Nishimura et al. | 313/495 |
| 6,221,766 B1 | 4/2001 | Wasserman | |
| 6,228,751 B1 | 5/2001 | Yamazaki et al. | |
| 6,235,122 B1 | 5/2001 | Zhang et al. | |
| 6,235,145 B1 | 5/2001 | Li et al. | |
| 6,252,617 B1 * | 6/2001 | Hasegawa et al. | 347/100 |
| 6,261,877 B1 | 7/2001 | Yamazaki et al. | |
| 6,267,122 B1 | 7/2001 | Guldi et al. | |
| 6,396,079 B1 * | 5/2002 | Hayashi et al. | 257/66 |
| 6,503,771 B1 | 1/2003 | Yamazaki | |
| 6,696,326 B2 | 2/2004 | Zhang et al. | |
| 6,849,872 B1 | 2/2005 | Yamazaki et al. | |
| 6,979,840 B1 | 12/2005 | Yamazaki et al. | |
| 7,038,238 B1 * | 5/2006 | Yamazaki | 257/53 |
| 2005/0064641 A1 | 3/2005 | Konuma | |
| 2005/0158901 A1 | 7/2005 | Yamazaki et al. | |
| 2008/0305569 A1 | 12/2008 | Kadono et al. | |

FOREIGN PATENT DOCUMENTS

| | | |
|---|---|---|
| JP | 5-55582 A | 3/1993 |
| JP | 7-66375 A | 3/1995 |
| JP | 9-171989 A | 6/1997 |
| JP | 9-260343 A | 10/1997 |
| JP | 9-293701 A | 11/1997 |
| JP | 10-22245 A | 1/1998 |
| JP | 10-135135 A | 5/1998 |
| JP | 10-135148 A | 5/1998 |
| JP | 11-16866 A | 1/1999 |
| JP | 11-17187 A | 1/1999 |

OTHER PUBLICATIONS

*Device Electronics for Integrated Circuits*, John Wiley & Sons, publisher, 2nd Edition, 1986, pp. 378-417.

Schroder, D.K., *Semiconductor Material and Device Characterization*, John Wiley & Sons, publisher, 2nd Edition, 1998, p. 351.

Kern, W., editor, *Handbook of Semiconductor Wafer Cleaning Technology: Science, Technology and Applications*, Noyes Publications, 1993, pp. 1-151; pp. 274-339; and pp. 433-496.

* cited by examiner

SEMICONDUCTOR DEVICE AND A METHOD OF MANUFACTURING THE SAME

This application is a divisional of U.S. application Ser. No. 12/174,124 filed Jul. 16, 2008 now U.S. Pat. No. 7,871,936 which is a continuation of U.S. application Ser. No. 09/535,233 filed Mar. 24, 2000 (now U.S. Pat. No. 7,402,467 issued Jul. 22, 2008).

BACKGROUND OF THE INVENTION

1. Field of the Invention

The present invention relates to a semiconductor device, such as a thin film transistor (TFT), using a crystalline semiconductor film formed over a substrate, and to a method of manufacturing the same. The semiconductor device of the present invention includes not only elements such as a thin film transistor (TFT) or a MOS transistor, but also includes liquid crystal display devices, EL display devices, EC display devices, and image sensors having a semiconductor circuit (such as a microprocessor, a signal processing circuit, or a high frequency circuit) structured by these insulating gate type transistors. In addition, the semiconductor device of the present invention includes electronic equipment which is loaded with these display devices, such as a video camera, a digital camera, a projector, a goggle display, a car navigation system, a personal computer, or a portable information terminal.

2. Description of the Related Art

At present, thin film transistors (TFTs) are used in various kinds of integrated circuits as semiconductor elements which use a semiconductor film, and in particular are used as switching elements in a pixel region of an active matrix type liquid crystal display device. In addition, in accordance with the high mobility of TFTs, they are also used as driver circuit elements driving the pixel region. It is necessary to use a crystalline semiconductor film, which has a higher mobility than an amorphous semiconductor film, as the semiconductor film used in the driver circuit. This crystalline semiconductor film is called a polycrystalline semiconductor film, a polysilicon film, or a microcrystalline semiconductor film.

When evaluating a TFT, the most important characteristic is reliability. Within the problem of reliability, the largest is that an alkaline metal (periodic table group 1 element), a mobile ion, mainly sodium (Na), becomes mixed in. The mixing-in is detected as a phenomenon in which Na is electrified to have a positive electric charge and Vth changes by Na moving as an ion throughout the film, preventing the practical use of the TFT. The following can be given as examples of this type of impurity (hereafter, impurities such as Na which cause the reliability of a TFT to drop are referred to as contaminating impurities throughout this specification): alkaline metals (periodic table group 1 elements) and alkaline earth metals (group 2 elements), such as sodium (Na), potassium (K), magnesium (Mg), calcium (Ca), and barium (Ba). The reduction of these contaminating impurities is indispensable for the manufacture of reliable TFTs. However, contaminating impurities get mixed with TFTs from a variety of impurity sources, such as gases in the atmosphere or high pressure gas cylinders, glass substrates, and manufacturing apparatus such as a sputtering device. In particular, the contamination from a glass substrate is a serious problem, and even by using a glass substrate with a Na composition of 0.1% or lower, this reliability problem has not been solved. Therefore, a blocking film such as a silicon nitride film is formed on the substrate, preventing contaminating impurities contained in the glass substrate from diffusing, and preventing a lowering of reliability.

However, as a result of analyzing the contaminating impurity concentration in a TFT, the contaminating impurity concentration of the interface between films structuring the TFT is between $5 \times 10^{16}$ atoms/cm$^3$ and $5 \times 10^{19}$ atoms/cm$^3$, higher in comparison to the contaminating impurity concentration within the films (generally $1 \times 10^{16}$ atoms/cm$^3$ or less), identifying the cause of the reduction in TFT reliability. In particular, the fact that a contaminating impurity exists in the interface between a semiconductor film and an insulating film in contact with the semiconductor film (an insulating film which functions as a gate insulating film (hereafter referred to as a gate insulating film), an insulating film which functions as a blocking film, or an interlayer insulating film), or in the interface between the gate insulating film and a film which contacts the gate insulating film (such as the semiconductor film, a gate wiring (this includes a gate electrode throughout this specification), or an interlayer insulating film), is a major cause of the harm to TFT reliability.

Note that the impurity concentrations throughout this specification are concentrations measured by performing an analysis in the depth direction by using secondary ion mass spectroscopy (hereafter referred to as SIMS). A SIMS analysis is a method in which a primary ion is irradiated onto a test sample, and a mass analysis is performed on secondary ions emitted from the test sample surface and from a depth of several angstroms. SIMS analysis is characterized by high detection sensitivity and the ability to analyze microscopic regions. However, an analysis using SIMS is performed by increasing the current density of the primary ion while sputtering the surface, and therefore there is a limit to the resolution ability in the depth direction. Therefore it is difficult to perform accurate measurements of the element concentration in the film interface, and SIMS analysis is actually done in succession for a first film and then for a second film in contact with the first film, measuring the element concentration in the interface between the first film and the second film, and in the neighboring area (to several angstroms). In the present specification, the concentration in the interface between the first film and the second film, and in the neighboring area (to several angstroms) is taken as the element concentration in the interface between the first film and the second film.

An example is shown in FIGS. 4 to 6B in which sodium (Na) exists in the interface between a gate wiring and a gate insulating film. FIGS. 4 and 5 show the result of SIMS analysis of a TFT. A SIMS analysis result before BT processing (bias temperature: heating while applying a voltage) is shown in FIG. 4, and a SIMS analysis result after BT processing is shown in FIG. 5. Note that the minimum detection level, or the background level, of Na in FIGS. 4 and 5 is approximately $1 \times 10^{15}$ atoms/cm$^3$.

Only one peak is observed showing the existence of Na in FIG. 4 (before BT processing). This is peak A seen in a location corresponding to the interface between the gate wiring and the gate insulating film, and the neighboring area. However, two peaks are observed showing the existence of Na after BT processing, as shown in FIG. 5. One of these peaks is the peak A, also shown in FIG. 4 (before BT processing), seen in the location corresponding to the interface between the gate wiring and the gate insulating film, and the neighboring area. The other peak is a peak B seen in a location corresponding to the interface between the gate insulating film and a semiconductor film, and its neighboring area, and is not seen in FIG. 4 (before BT processing). It is thus understood from FIGS. 4 and 5 that Na moves within the gate insulating film due to BT processing. As a result, changes are seen in the ID-VG characteristics from before BT processing (solid line) to after BT processing (broken line) for both an n-channel TFT (shown in FIG. 6A) and a p-channel TFT (shown in FIG. 6B). This shows fluctuations in threshold voltage ($V_{th}$), one of parameters for evaluating TFT characteristic, and it shows a result in which the TFT reliability is harmed.

SUMMARY OF THE INVENTION

An object of the present invention is to lower the concentration of a contaminating impurity not only within a film for forming a TFT, but also in a film interface, to a level at which it does not have an influence on the reliability of a TFT. Another object of the present invention is to form a low cost, large screen, high performance semiconductor device using a TFT with increased reliability.

Note that the above objects of the present invention are objects related to a film interface in which the films are not deposited in succession, and are not objects related to a film interface in which the films are deposited in succession. This is because contaminating impurities are basically not mixed into an interface between two films when the films are deposited in succession, and because the concentration of contaminating impurities in the film interface can be made on the same order as the low concentration of contaminating impurities within the films. However, successive film deposition must be performed using a successive film deposition apparatus, and cannot be done easily. An object of the present invention is to easily reduce the contaminating impurity concentration in a film interface without using a successive film deposition apparatus. In addition, an object of the present invention is to reduce the contaminating impurity concentration of a film interface which cannot be formed successively. In practice, if an insulating film exists on an amorphous semiconductor film, crystallization of the amorphous semiconductor film by annealing is difficult, and therefore crystallization is performed in a state in which there is no insulating film on the semiconductor film. The present invention can therefore be applied with the object of reducing the contaminating impurity concentration in the interface between the semiconductor film and the insulating film formed in contact with the semiconductor film. Furthermore, the present invention can be applied with the object of reducing the contaminating impurity concentration in the interface between the insulating film and the gate wiring, for gate insulating films and gate wirings are generally not formed in succession.

In order to realize the above objects, the present invention is characterized in that after forming a first film, a contaminating impurity is removed from the surface of the first film before fowling a second film on the first film, and in that the second film is formed on the surface of the first film from which the contaminating impurity has been removed as speedily as possible. In other words, the present invention is characterized by comprising a step of forming a first film, a step of removing a contaminating impurity from the surface of the first film, and a step of forming a second film so as to come in contact with the first film, from which the contaminating impurity has been removed.

An acidic solution containing fluorine is used as an etching solution in the removal of the contaminating impurity from the surface of the first film in the above constitution, and an extremely thin (5 nm or less) surface of the first film is etched. It is effective to use a means of spinning the substrate by using a spinning apparatus (spin etcher), and scattering the etching solution contacting the film surface (also called spin etching or spin etch), as a means of extremely thin etching.

The following can be used as the acidic solution containing fluorine: hydrofluoric acid, dilute hydrofluoric acid, ammonium fluoride, buffered hydrofluoric acid (a solution mixture of hydrofluoric acid and ammonium fluoride, hereafter referred to as BHF), FPM (hydrofluoric acid and aqueous hydrogen peroxide), and LAL500 (a solution mixture including ammonium hydrofluoride ($NH_4HF_2$) at 7.13% and ammonium fluoride ($NH_4F$) at 15.4%), in which the composition of Na is regulated at 0.5 ppb or lower, 0.05 ppb or lower in actual analysis. When the contaminating impurity in the surface of the film is thus removed by using an acidic solution containing fluorine, it is thought that a microscopic amount of fluorine elements remain in the film surface, but no influence imparted to the characteristics of the TFT is seen since fluorine is alkaline metal or alkaline earth metal and not a mobile element.

The contaminating impurity concentration in the film interface of a semiconductor device manufactured in accordance with the above structure is within the noise level of the contaminating impurity concentration within the film, and the concentration can be regarded as approximately the same as the concentration of the contaminating impurity within the film. The sodium concentration within the film can be suppressed by using a blocking film, as low as to $2 \times 10^{16}$ atoms/$cm^3$ or less in a SIMS analysis, and, depending upon the conditions, can be reduced below the minimum detection level or less as is currently detected, taking noise into account, to $1 \times 10^{16}$ atoms/$cm^3$ or less. Thus the contaminating impurity concentration in the film interface of a semiconductor device in accordance with the present invention can be reduced to approximately the same as the concentration of the contaminating impurity within the film, $2 \times 10^{16}$ atoms/$cm^3$ or less, and depending upon the conditions, it can be reduced below the minimum detection level or less as is currently detected, taking noise into account, to $1 \times 10^{16}$ atoms/$cm^3$ or less. Note that the above structure shows a case in which the contaminating impurity in the surface of the film is removed by an acidic solution containing fluorine, but other acidic solution or organic solvents which can remove the contaminating impurity from the film surface can also be used.

Therefore, a semiconductor device of the present invention is characterized by having a first film and a second film formed in contact with the first film, in which the concentration of a contaminating impurity in the interface between the first film and the second film is $2 \times 10^{16}$ atoms/$cm^3$ or less.

Furthermore, another semiconductor device of the present invention is characterized by comprising a first film and a second film formed in contact with the first film, in which the concentration of a contaminating impurity within the first film, the concentration of the contaminating impurity within the second film, and the concentration of the contaminating impurity in the interface between the first film and the second film is $2 \times 10^{16}$ atoms/$cm^3$ or less.

The above structures can also be characterized in that the first film and the second film are a crystalline semiconductor film and an insulating film contacting the crystalline semiconductor film, respectively.

Further, the above structures can also be characterized in that the first film and the second film are an insulating film which functions as a gate insulating film and a gate wiring contacting the insulating film, respectively.

An example is shown in FIG. 7 of a SIMS analysis result performed on removal of a contaminating impurity in the interface between a gate insulating film and a gate wiring. A peak A showing the existence of Na is observed in the interface between the gate insulating film and the gate wiring of FIG. 7, but it can be understood that the concentration is considerably low at between $1\times10^{16}$ atoms/cm$^3$ and $2\times10^{16}$ atoms/cm$^3$. Note that the minimum detection of Na and the background level in FIG. 7 are approximately $2\times10^{14}$ atoms/cm$^3$.

By using the structure of the present invention, the contaminating impurity concentration in the film interface can be reduced, and therefore the contaminating impurity concentration in SIMS analysis can be made $2\times10^{16}$ atoms/cm$^3$ or less, and, depending upon the conditions, can be made $1\times10^{16}$ atoms/cm$^3$ or less, below the minimum detection level or less as is currently detected, taking noise into account. Therefore, fluctuation in the TFT characteristics can be reduced, and the TFT reliability can be increased.

The contaminating impurity in the structure of the present invention indicates one element or a multiple number of elements selected from among periodic table group 1 elements or group 2 elements. In particular, it indicates one element or a multiple number of elements selected from among Na, K, Mg, Ca, and Ba. Especially, it indicates Na.

Further, the film in the structure of the present invention indicates a film formed by using all means of formation, such as plasma CVD, thermal CVD, reduced pressure thermal CVD, evaporation, sputtering, thermal oxidation, and anodic oxidation.

In cases where a glass substrate is used as the substrate and the film surface is etched by immersing the substrate in an acidic solution containing fluorine (such as hydrofluoric acid, dilute hydrofluoric acid), although slight, the glass substrate will erode, and contaminating impurities within the glass substrate mix into the acidic solution, contaminating the acidic solution. If the surface of the films structuring the TFT contacts the contaminated acidic solution, then this is a source of contamination, and is a problem. Then for cases in which a glass substrate is used, in the present invention, the etching is not performed by immersion in the acidic solution, but instead removal of the contaminating impurity in the film surface is performed by using a means of spinning the substrate using a spinning apparatus (spin etcher) and scattering the acidic solution contacting the film surface (also called spin etching, and spin etch). If spin etching is used, then etching can be performed without the contaminated acidic solution contacting the surface of the films structuring the TFT. Note that it is not always necessary to use spin etching. For example, by using a means in which the etching solution flows in a constant direction, it is possible to remove the contaminating impurity in the film surface without contaminating the film surface. Further, by covering the entire top, bottom, and side surfaces of the glass substrate with a film having acid resistance, then it is possible to prevent erosion of the substrate by the acidic solution, and it is also possible to prevent the acidic solution from being contaminated by contaminating impurities within the substrate.

DETAILED DESCRIPTION OF THE PREFERRED EMBODIMENTS

Figure 1A:
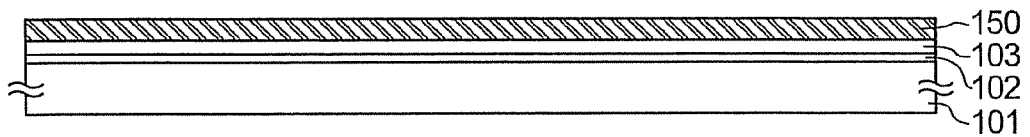
FIGS. 1A to 1F are diagrams showing a process of manufacturing a TFT according to Embodiment 1.
Figure 1B:
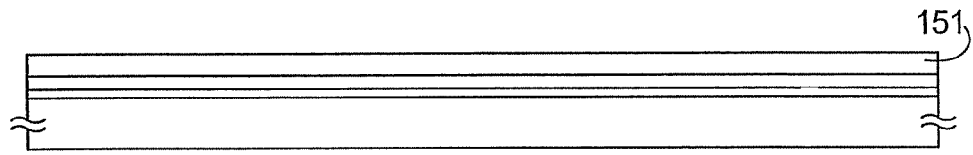
Figure 1C:
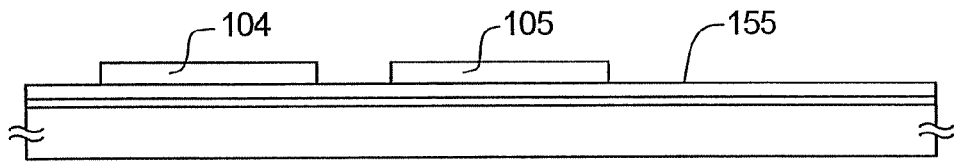
Figure 1D:
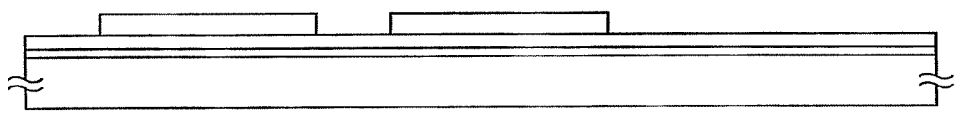
Figure 1E:
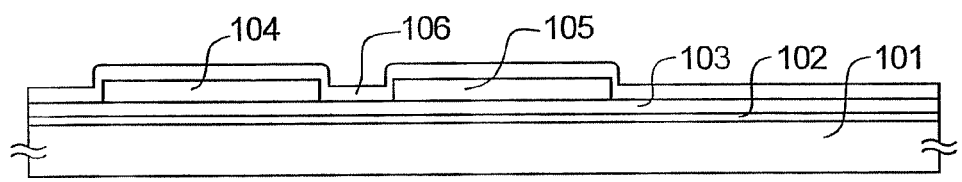
Figure 1F:
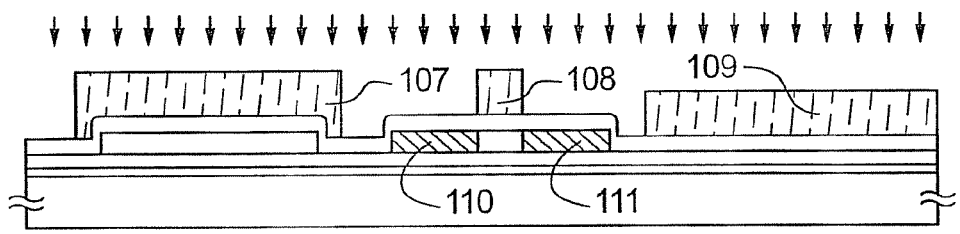

The embodiments of the present invention are explained below, but of course the present invention is not limited to these.

[Embodiment 1]

Embodiment 1 of the present invention is explained by using FIGS. 1A to 3C. An n-channel TFT and a p-channel TFT are manufactured on the same substrate, and an embodiment in which an inverter circuit, a basic CMOS structure, is formed is explained here.

Substrates such as a glass substrate, a plastic substrate, and a ceramic substrate can be used as a substrate 101. Further, a silicon substrate on whose surface an insulating film such as a silicon oxide film or a silicon nitride film is formed, and a metallic substrate, typically stainless steel, may also be used. Of course it is also possible to use a quartz substrate.

A base film 102 made from a silicon nitride film, and a base film 103 made from a silicon oxide film are then formed on at least the surface of the substrate 101 on which the TFTs are formed. The base films are formed by plasma CVD or sputtering, and are formed as blocking films in order to prevent diffusion of contaminating impurities which are harmful to the TFTs from the substrate 101 to a semiconductor film. Therefore the base film 102 made from a silicon nitride film is formed with a thickness of 20 to 100 nm, typically 50 nm, and in addition the base film 103 made from a silicon oxide film is formed with a thickness of 50 to 500 nm, typically between 150 and 200 nm.

Of course the base films may be formed of only one of the base film 102 made from a silicon nitride film, and the base film 103 made from a silicon oxide film, or formed of other insulating films such as a nitrated silicon oxide film, but considering TFT reliability, a two-layer structure is used in Embodiment 1.

It is preferable to use, as the semiconductor film formed contacting the base film 103, an amorphous semiconductor film formed by a film deposition method such as plasma CVD, reduced pressure CVD, or sputtering and a crystalline semiconductor film crystallized by a solid state growth method such as laser crystallization or heat treatment. Further, it is possible to apply a microcrystalline semiconductor film formed by the above film deposition methods. Semiconductor materials which can be applied here include silicon (Si), germanium (Ge), silicon germanium alloy, and silicon carbide, and compound semiconductor materials such as gallium arsenide can also be used.

An amorphous semiconductor film 150 is formed with a thickness of 10 to 100 nm, typically 50 nm. An amorphous semiconductor film, an amorphous semiconductor film having microcrystals, and a microcrystalline semiconductor film can be used as the amorphous semiconductor film 150. Hydrogen is contained at a ratio of between 10 and 40 atom % in an amorphous semiconductor film formed by plasma CVD, and therefore it is preferable to perform a heat treatment process at 400 to 500° C. before crystallization, driving hydrogen out from within the film and reducing the contained hydrogen amount to 5 atom % or less. Further, the amorphous semiconductor film may be formed by other methods such as sputtering or evaporation, but sufficient care must be taken so that alkaline metals such as sodium do not mix into the film. (See FIG. 1A)

Furthermore, it is possible to use the same deposition method for the base films and the amorphous semiconductor film, and therefore successive formation of the base film 102, the base film 103, and in addition, the amorphous semiconductor film 150 is desirable. By forming the next film without exposing the film surface to the atmosphere after forming each of the respective films, impurity contamination in the film interfaces can be prevented. As a result, one cause of the development of dispersion in TFT characteristics can be eliminated. Note that for cases in which the base films and the semiconductor film are not formed successively, it is good to remove contaminating impurities from the base film surface before forming the semiconductor film.

A known laser crystallization technique or a known thermal crystallization technique may be used for a crystallization process of the amorphous semiconductor film 150. Further, a crystalline semiconductor film can be obtained by a thermal crystallization technique using a catalytic element. In addition, if a gettering process is carried out on a crystalline film 151 formed by a thermal crystallization technique using a catalytic element, and the catalytic element is removed, then superior TFT characteristics can be obtained. (See FIG. 1B)

When using a laser crystallization technique, a pulse emission type or a continuous emission type excimer laser, or a solid state laser such as a YAG laser, a $YVO_4$ laser, a YLF laser, or a $YAlO_3$ laser is used. If a laser diode excitation method is used for these solid state lasers, then high output, high repeatability frequency can be realized. The second harmonic (532 nm), the third harmonic (355 nm), and the fourth harmonic (266 nm) of a YAG laser, a $YVO_4$ laser, a YLF laser, or a $YAlO_3$ laser can be used. Roughly speaking, for cases in which laser light with a wavelength of 400 nm or greater is irradiated, the inside of the semiconductor film is heated by the overlap with the light penetration depth, and crystallization can occur. On the other hand, with wavelengths of less than 400 nm, heating is carried out from the semiconductor film surface and crystallization can occur. Whichever is used, crystallization is performed with an appropriate emission pulse number and emission energy density.

When using a laser, a method may be used in which the laser light emitted from a laser emission device is condensed into a linear shape by an optical system and then irradiated to the semiconductor film. The crystallization conditions are appropriately selected by the operator, but if an excimer laser is used, the pulse emission frequency is set to 30 Hz, and the laser energy density is between 100 and 400 $mJ/cm^2$ (typically from 200 to 300 $mJ/cm^2$). Further, if a YAG laser is used, then the second harmonic is used and the pulse emission frequency is set to between 1 and 10 kHz, and the laser energy density may be from 300 to 600 $mJ/cm^2$ (typically between 350 and 500 $mJ/cm^2$). Laser light which has been condensed into a linear shape with a width of 100 to 1000 μm, for example 400 μm, is then irradiated on the entire substrate surface, and irradiation is performed with the overlap ratio of the linear shape laser light between 80 and 98% at this point.

A crystalline semiconductor film 151 formed in accordance with a crystallization process is formed into a first island shape semiconductor film 105 and a second island shape semiconductor film 104 by using a first photo mask to form a resist mask by using a known patterning method, and then dry etching. (See FIG. 1C)

Removal of a contaminating impurity 155 existing in the surface of the first island shape semiconductor film 105 and in the second island shape semiconductor film 104 is performed next. The removal of the contaminating impurity 155 is performed by a scattering means (also called spin etching and spin etch) using a spinner device (spin etcher) to spin the substrate at 600 rpm for 10 seconds, scattering an acidic solution containing fluorine which is dripped onto the film surface and brought into contact therewith. A buffered hydrofluoric acid (BHF) solution of hydrofluoric acid and ammonium fluoride at a mixture ratio of 1:50 by volume is used here as the acidic solution containing fluorine. By using spin etching, an extremely thin film can be removed, and contamination of the film surface by contaminated acid solution can be prevented. Note that appropriate optimal settings for the conditions such as rotation rate of the spinner device and spin time may be found in accordance with the substrate surface area, etching solution concentration, and film material. Further, 1:50 BHF is used as the etching solution, but other acid solution containing fluorine such as BHF with a different mixture ratio and FPM can also be used. (See FIG. 1D)

A gate insulating film 106 with silicon oxide or silicon nitride as its principal constituent is then formed on the surfaces of the first island shape semiconductor film 105 and the second island shape semiconductor film 104, from which the contaminating impurity 155 has been removed. The gate insulating film 106 is formed by plasma CVD or sputtering, and is formed with a film thickness of 10 to 200 nm, preferably from 50 to 150 nm. Note that by forming the gate insulating film promptly after removal of the contaminating impurity 155, a low contaminating impurity concentration in the interface between the gate insulating film 106 and the semiconductor films 104 and 105 can be maintained, with a value of $2 \times 10^{16}$ $atoms/cm^3$ or less. (See FIG. 1E)

Resist masks 107 and 108 are then formed covering channel forming regions of the second island shape semiconductor film 104 and the first island shape semiconductor film 105 by using a second photo mask. A resist mask 109 may also be formed at this point in the region forming a wiring.

A second valence electron control impurity region is then formed by doping an impurity element which imparts n-type conductivity. Impurities which impart conductivity are hereafter referred to as valence electron control impurities in order to differentiate them from contaminating impurities throughout this specification. Also, since the impurities are doped with intent to impart n-type or p-type conductivity, they may be referred to as doped impurities. Elements such as phosphorous (P), arsenic (As), and antimony (Sb) are known as valence electron control impurity elements which impart n-type conductivity into a crystalline semiconductor material, and the second valence electron control impurity region is formed herein by performing ion doping using phosphine (PH$_3$) with phosphorous taken as the valence electron control impurity. Phosphorous is doped through the gate insulating film 106 and into the underlying semiconductor films by this process, and therefore the acceleration voltage is set high at 80 keV. The concentration of phosphorous doped into the semiconductor films is preferably in the range of $1\times10^{16}$ to $1\times10^{19}$ atoms/cm$^3$, and is set to $1\times10^{18}$ atoms/cm$^3$ here. Thus regions 110 and 111 in which phosphorous has been doped are formed in the semiconductor films. A portion of the second valence electron control impurity region formed here functions as an LDD region. (See FIG. 1F)

The resist masks are then removed. A commercially available alkaline peeling liquid may be used to remove the resist masks, but use of an ashing method is effective. An ashing method is a method in which a plasma is formed in an oxide atmosphere and the hardened resist is exposed to the plasma and removed, and it is effective to add water vapor to the atmosphere in addition to oxygen. (See FIG. 2A)

Removal of a contaminating impurity 156 on the surface of the gate insulating film 106 is performed next. Similar to the contaminating impurity removal from the surface of the first island shape semiconductor film 105 and from the surface of the second island shape semiconductor film 104, spin etching is performed for the contaminating impurity removal using BHF as the acidic solution containing fluorine. An extremely thin film can be removed, and contamination of the film surface by contaminated acid solution can be prevented. Other fluorine containing acidic solutions such as FPM can also be used here as the etching solution. (See FIG. 2B)

A first conducting film 112 is then formed contacting the gate insulating film 106, from whose surface the contaminating impurity 156 has been removed. The first conducting film 122 is formed using a conductive material which has an element selected from among Ta, Ti, Mo, and W as its principal constituent. The first conducting film 112 is formed with a thickness of 10 to 100 nm, preferably between 150 and 400 nm. Note that by forming the first conducting film 112 promptly after removal of the contaminating impurity 156, a low contaminating impurity concentration in the interface between the first conducting film 112 and the gate insulating film 106 can be maintained, with a value of $2\times10^{16}$ atoms/cm$^3$ or less. (See FIG. 2C)

In addition, the first conducting film can be formed using compound materials such as WMo, TaN, MoTa, and WSi$_x$ (where 2.4<x<2.7).

Conductive materials such as Ta, Ti, Mo, and W have a resistivity which is high when compared to Al or Cu, but this does not become a problem with the surface area of the manufactured circuit in the range of 100 cm$^2$, and these materials can be used.

Resist masks 113 to 116 are formed next using a third photo mask. The resist mask 113 is a mask for forming a gate electrode of the p-channel TFT, and resist masks 115 and 116 are a mask for forming a gate wiring and a gate bus line of the p-channel TFT. Furthermore, the resist mask 114 is formed covering the entire surface of the first island shape semiconductor layer, and is formed as a mask in order to prevent a valence electron control impurity from being doped in the next process.

Unnecessary portions of the first conducting film are removed by using dry etching, forming a second gate electrode 117, a gate wiring 119, and a gate bus line 120. An ashing process may also be performed for cases in which some residual remains after etching.

The resist masks 113 to 116 are then left as is, and a process is performed to dope a valence electron control impurity element which imparts p-type conductivity into a portion of the second island shape semiconductor film 104 in which the p-channel TFT is formed, forming a third valence electron control impurity region. Boron (B), aluminum (Al), and gallium (Ga) are known as valence electron control impurity elements which impart p-type conductivity, and boron is doped here as the inject impurity element by ion doping using diborane (B$_2$H$_6$). The acceleration voltage is also set to 80 keV here, and boron is doped to a concentration of $2\times10^{20}$ atoms/cm$^3$. Thus third valence electron control impurity regions 121 and 122 are formed with a high concentration of boron, as shown in FIG. 2D.

Figure 2A:
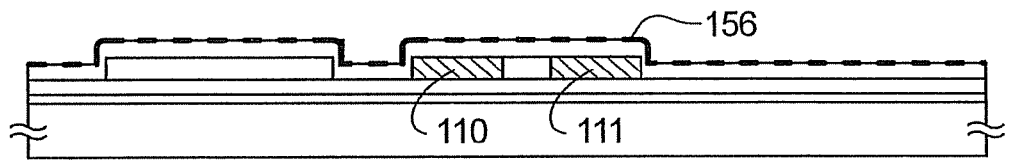
FIGS. 2A to 2E are diagrams showing the process of manufacturing the TFT according to Embodiment 1.
Figure 2B:
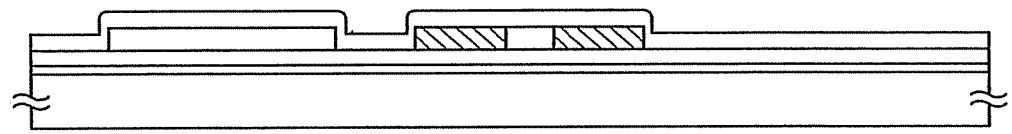
Figure 2C:
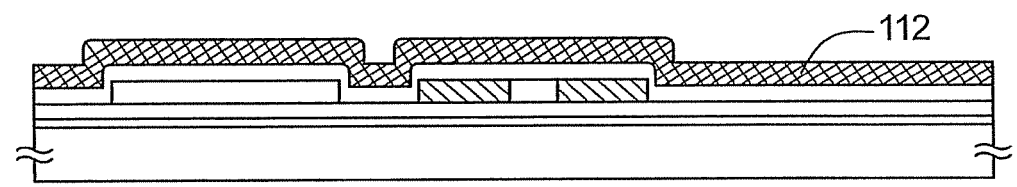
Figure 2D:
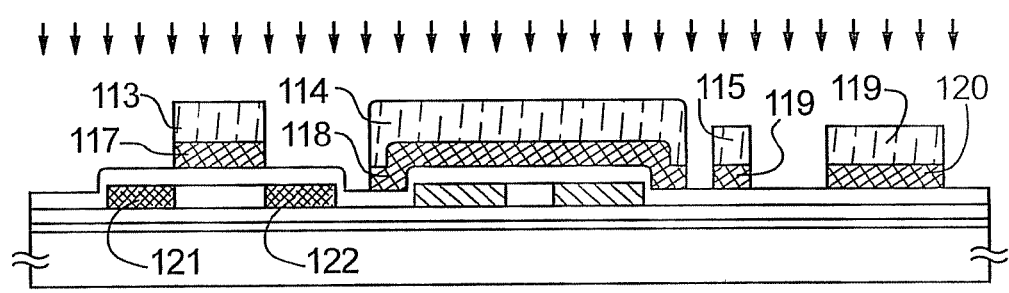
Figure 2E:
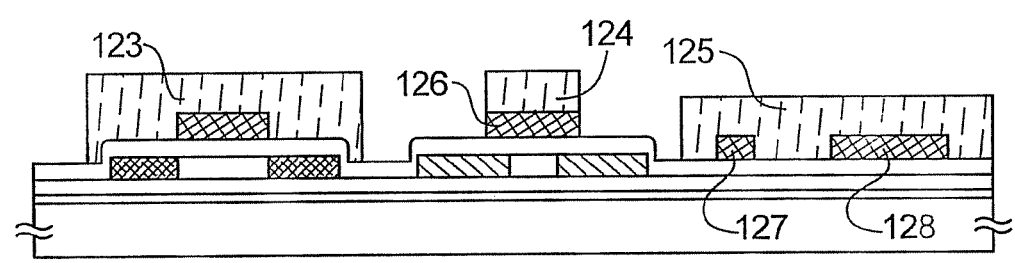

After removing the resist masks formed in FIG. 2D, resist masks 123 to 125 are formed using a fourth photo mask. The fourth photo mask is used to form a gate electrode of the n-channel TFT, and a first gate electrode 126 is formed by dry etching. The first gate electrode 126 is formed at this point so that it overlaps with a portion of the second valence electron control impurity regions 110 and 111 through the gate insulating film when seen from above. (See FIG. 2E)

The resist masks 123 to 125 are then completely removed, after which resist masks 129 to 131 are formed from a fifth photo mask. The resist mask 130 covers the first gate electrode 126, and is formed so as to overlap a portion of the second valence electron control impurity regions 110 and 111 when seen from above. The resist mask 130 is for determining the amount of offset of the LDD region.

Further, the resist mask 130 may be used here and a portion of the gate insulating film may be removed, exposing the surface of the semiconductor film in which a first valence electron control impurity region is formed. The process of doping a valence electron control impurity element which imparts n-type conductivity can thus be effectively carried out in the next step.

A process of doping a valence electron control impurity element which imparts n-type conductivity is then performed, forming the first valence electron control impurity region. Thus first valence electron control impurity regions 132 and 133, which become a source region and a drain region, are formed. Ion doping is performed here using phosphine (PH$_3$). The acceleration voltage is set high at 80 keV for this process too in order to dope phosphorous through the gate insulating film 106 and into the underlying semiconductor layers. The phosphorous concentration of these regions is high when compared to the process of doping the first valence electron control impurity which imparts n-type conductivity, and is preferably from $1\times10^{19}$ and $1\times10^{21}$ atoms/cm$^3$. It is set to $1\times10^{20}$ atoms/cm$^3$ here. (See FIG. 3A)

First interlayer insulating films 134 and 135 are then formed over the surface of the gate insulating film 106, the first and second gate electrodes 126 and 117, the gate wiring 127, and the gate bus line 128. The first interlayer insulating film 134 comprises silicon nitride with a thickness of 50 nm. Further, the first interlayer insulating film 135 comprises silicon oxide with a thickness of 950 nm. Note that it is preferable to perform contaminating impurity removal from the surface before forming the first interlayer insulating films.

The first interlayer insulating film 134 made from the silicon nitride formed here is necessary in order to perform the subsequent heat treatment process. It is effective in preventing oxidation of the surfaces of the first and second gate electrodes 126 and 117, the gate wiring 127, and the gate bus line 128.

It is necessary to perform the heat treatment process in order to activate the valence electron control impurity elements which impart n-type conductivity or p-type conductivity doped at the respective concentrations. This process may be performed by thermal annealing using an electric heating furnace, by laser annealing using the above described excimer laser, and by a rapid thermal annealing (RTA) method using a halogen lamp. Activation can be achieved at a low substrate heating temperature with laser annealing, but it is difficult to activate regions hidden under the gate electrodes. Therefore, the activation process is performed here by using thermal annealing. The heat treatment process is performed in a nitrogen atmosphere at between 300 and 700° C., preferably between 350 and 550° C., and is performed here at 450° C. for 2 hours.

When using a laser annealing method, a pulse emission type or a continuous emission type excimer, or a solid state laser such as a YAG laser, a $YVO_4$ laser, a YLF laser, or a $YAlO_3$ laser can be applied. If a laser diode excitation method is used for these solid state lasers, then high output, high repeatability frequency can be realized. The second harmonic (532 nm), the third harmonic (355 nm), and the fourth harmonic (266 nm) of a YAG laser, a $YVO_4$ laser, a YLF laser, or a $YAlO_3$ laser can be used. Roughly speaking, for cases in which laser light with a wavelength of 400 nm or greater is irradiated, the inside of the semiconductor film is heated by the overlap with the light penetration depth, and annealing can be performed. On the other hand, with wavelengths of less than 400 nm, heating is carried out from the semiconductor film surface, and annealing can occur. Whichever is used, laser annealing is performed with an appropriate number of emission pulses and emission energy density.

Between 3 and 90% hydrogen may be added to the nitrogen atmosphere in the heat treatment process. Further, a hydrogenation process may be performed after heat treatment in a 3 to 100% hydrogen atmosphere at 150 to 500° C., preferably between 300 and 450° C., for 2 to 12 hours. Furthermore, hydrogen plasma processing may be preformed at a substrate temperature of 150 to 500° C., preferably from 200 to 450° C. Whichever is performed, the TFT characteristics can be raised by hydrogen compensating for defects remaining within the semiconductor films and the interfaces between them.

After next forming resist masks in a predetermined shape using a sixth photo mask, contact holes reaching the source regions and the drain regions of the respective TFTs are then formed in the first interlayer insulating films 134 and 135. A second conducting film is then formed, and source electrodes and drain electrodes 136 to 138 are formed by patterning using a seventh photo mask. Although not shown in the figures, in Embodiment 1, the second conducting film is used as a three layer structure of a 100 nm thick Ti film, a 300 nm thick Al film which contains Ti, and a 150 nm thick Ti film, formed successively by sputtering.

The p-channel TFT is thus formed in a self aligning manner in the gate electrode, and the n-channel TFT is formed in a non-self aligning manner in the gate electrode by the above processes.

A channel forming region 142, first valence electron control impurity regions 145 and 146, and second valence electron control impurity regions 143 and 144 are formed in the n-channel TFT of the CMOS circuit. The second valence electron control impurity regions here are formed with regions (GOLD regions) 143*a* and 144*a*, respectively, which overlap the gate electrode, and with regions (LDD regions) 143*b* and 144*b*, respectively, which do not overlap the gate electrode. The first valence electron control impurity regions 145 and 146 become source regions and drain regions.

On the other hand, a channel forming region 139 and third valence electron control impurity regions 140 and 141 are formed in the p-channel TFT. The third valence electron control impurity regions 140 and 141 then become source regions and drain regions. (See FIG. 3B)

Figure 3A:
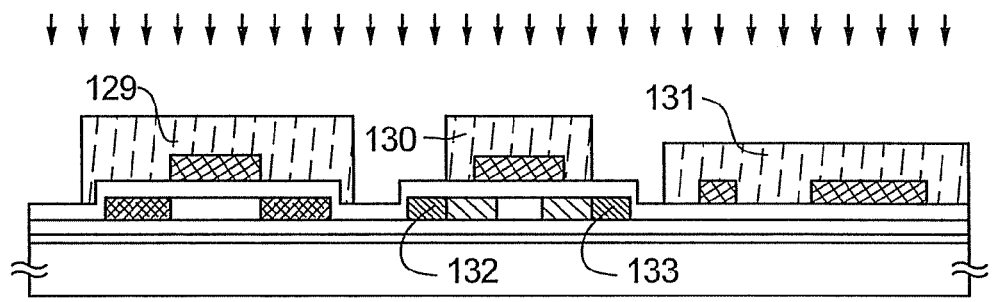
FIGS. 3A to 3C are diagrams showing the process of manufacturing the TFT according to Embodiment 1.
Figure 3B:
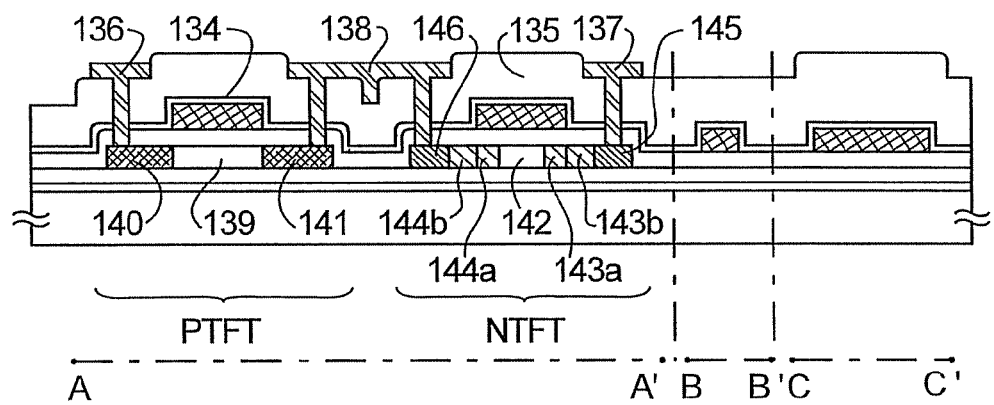
Figure 3C:
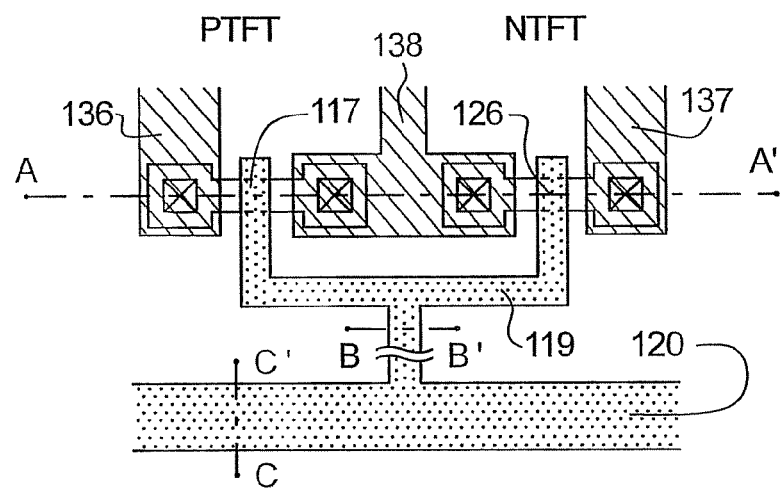
Figure 4:
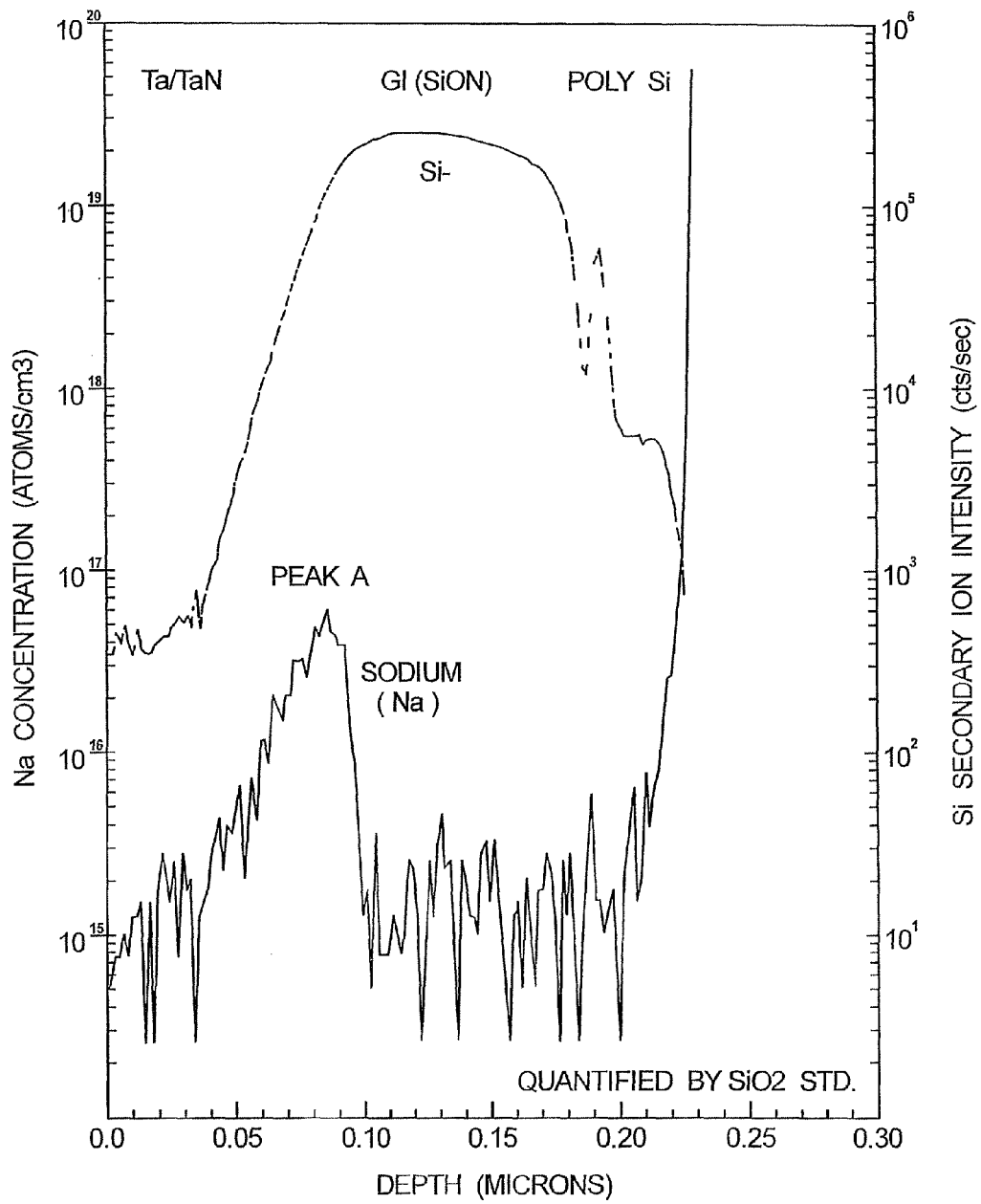
FIG. 4 is a diagram showing an example of conventional SIMS analysis data.
Figure 5:
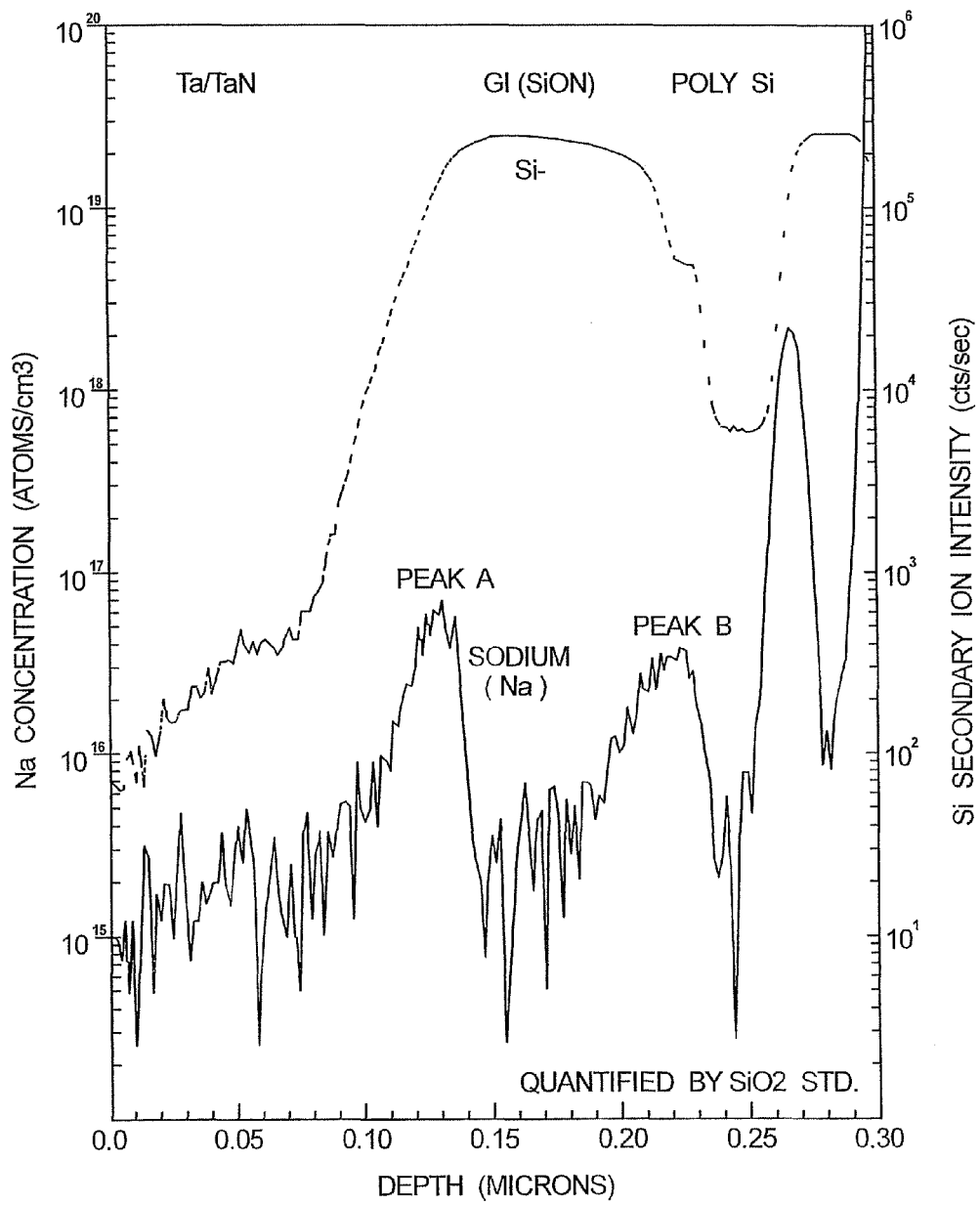
FIG. 5 is a diagram showing an example of conventional SIMS analysis data.
Figure 6A:
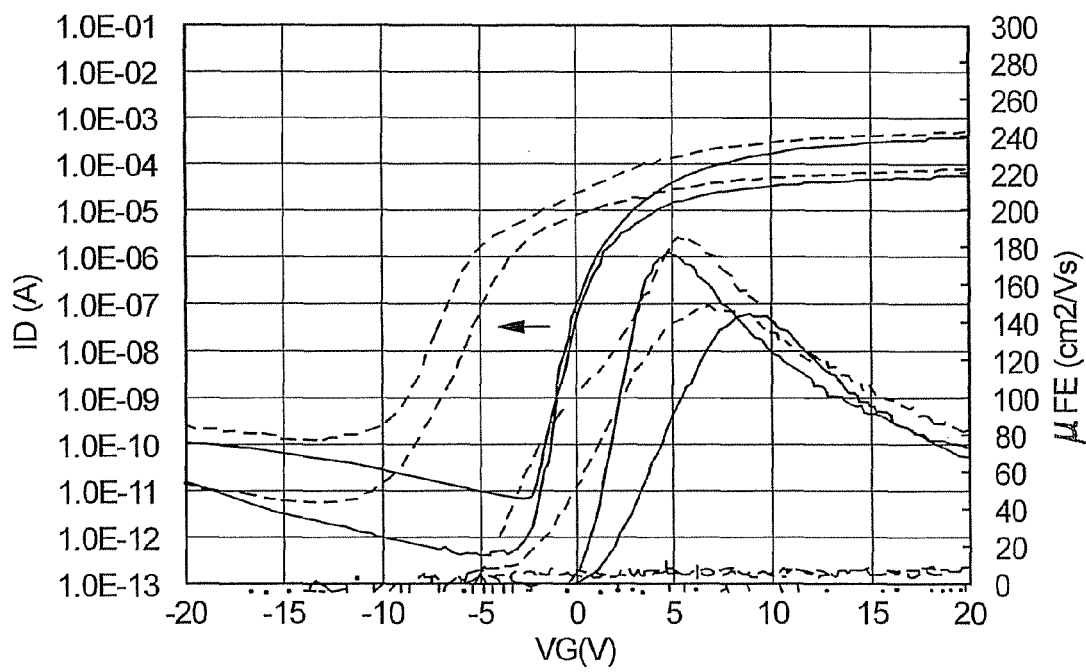
FIGS. 6A and 6B are diagrams showing an example of conventional ID-VG data.
Figure 6B:
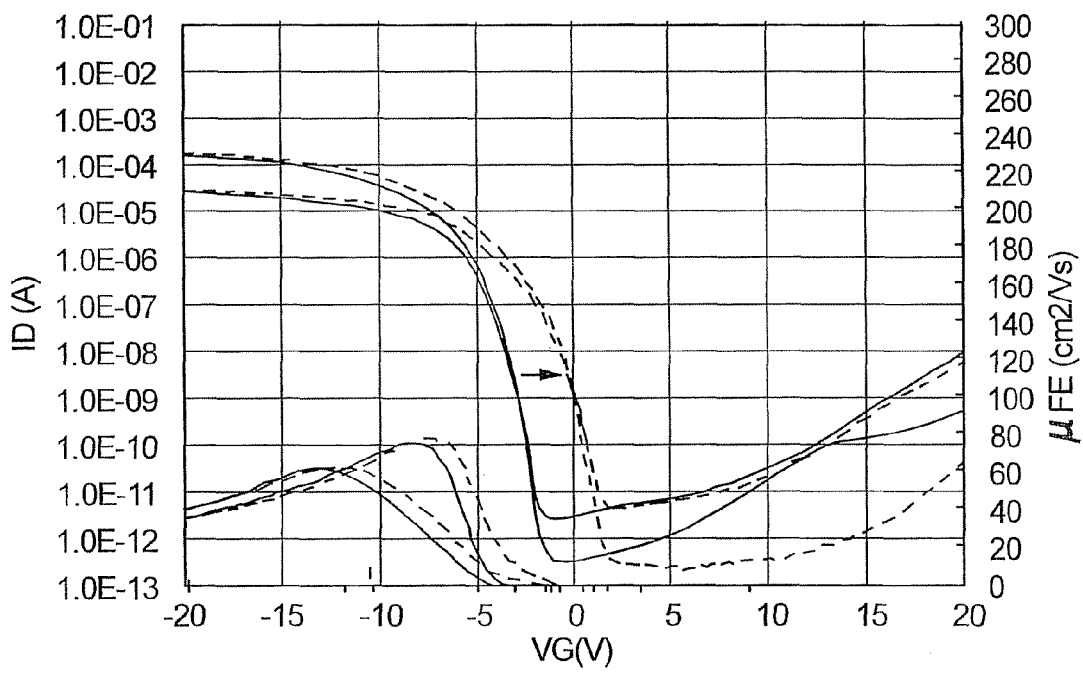
Figure 7:
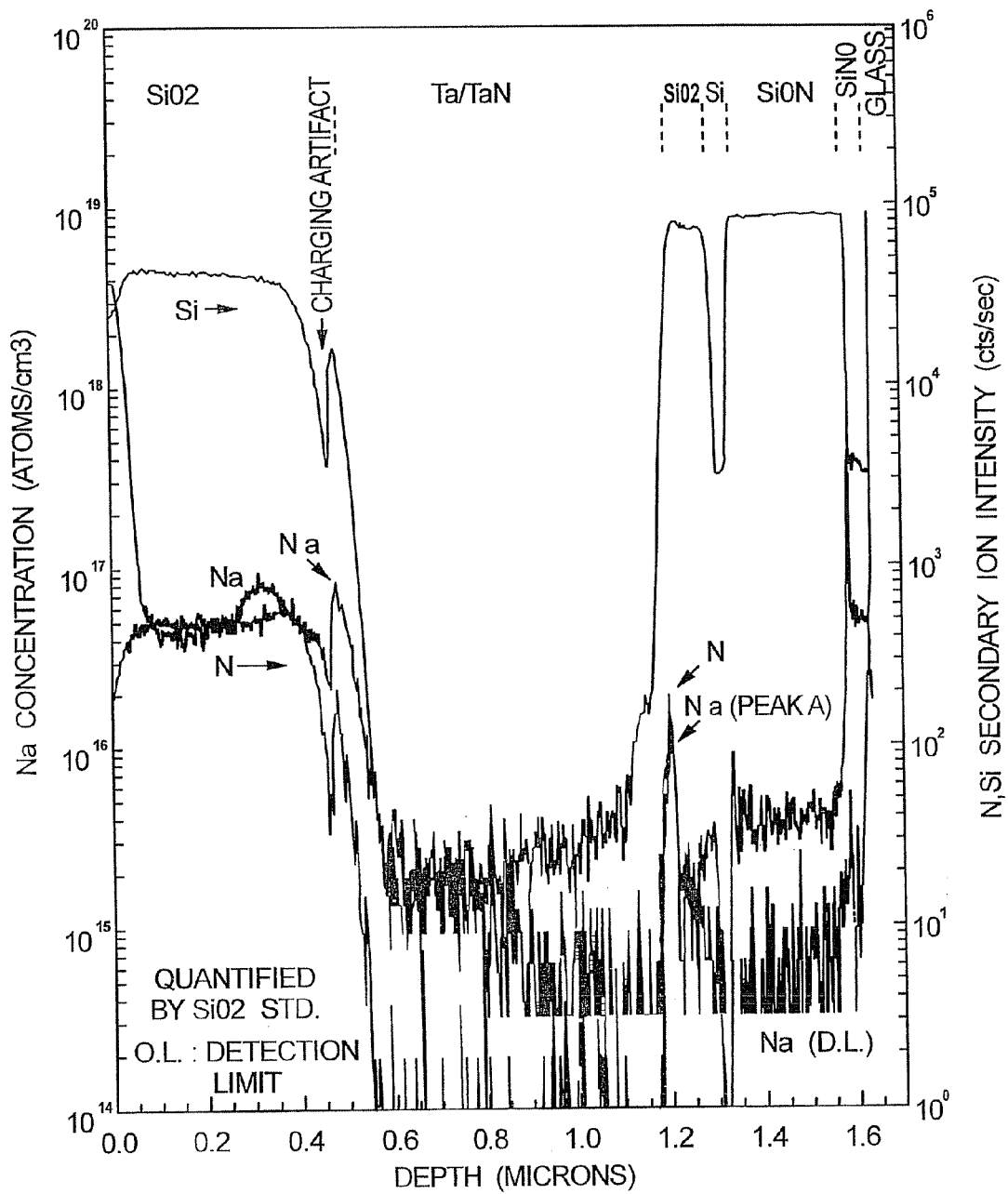
FIG. 7 is a diagram showing an example of SIMS analysis data.

Further, FIG. 3C shows a top view of the inverter circuit, and a cross sectional structure of the section taken along the line A-A', a cross sectional section of the gate wiring section taken along the line B-B', and a cross sectional structure of the gate bus line section taken along the line C-C' correspond to those in FIG. 3B. The gate electrode, the gate wiring, and the gate bus line are formed from the first conducting film in the present invention. Note that a distinction is made between the gate electrode, the gate wiring, and the gate bus line in Embodiment 1, but there are times when these are taken together as gate wirings.

An example is shown in FIGS. 1A to 3C of a CMOS circuit made from the n-channel TFT and the p-channel TFT formed in combination in a complimentary manner, but the present invention can also be applied to a NMOS circuit using an n-channel TFT, and to a pixel region of a liquid crystal display device.

The contaminating impurity concentration in the film boundaries can be reduced in Embodiment 1, and therefore the concentration of harmful contaminating impurities can be reduced to $2 \times 10^{16}$ atoms/cm$^3$ or less in SIMS analysis, and can be reduced below the minimum detection level or less as is currently detected taking noise into account, or $1 \times 10^{16}$ atoms/cm$^3$ or less, depending upon the conditions. Therefore, dispersion in the TFT characteristics can be reduced, and the TFT reliability can be increased.

In addition, a process of controlling the threshold voltage of the TFT by performing doping of a valence electron control impurity into the amorphous semiconductor film before the crystallization process may be added in the above Embodiment 1. A process of, for example, forming a controlling insulating film (100 to 200 nm film thickness) and doping boron at a concentration in a range at which the threshold voltage can be controlled (between $1 \times 10^{16}$ and $1 \times 10^{17}$ atoms/cm$^3$ in SIMS analysis), and then removing the controlling insulating film, can be employed as the process performing threshold voltage control.

Further, an example of performing patterning of the crystalline semiconductor film after the crystallization process is shown in Embodiment 1, but there are no limitations placed upon this, and patterning may be performed, for example, before the crystallization process or before the doping process.

In addition, although a top gate type TFT is shown in Embodiment 1 as an example, the present invention can also be applied to a bottom gate type TFT.

Furthermore, removal of the contaminating impurity is performed on the surfaces of the semiconductor islands and the surface of the gate insulating film in Embodiment 1, but contaminating impurity removal may also be applied to other areas, such as the surfaces of the base films or the surfaces of the interlayer insulating films.

[Embodiment 2]

Embodiment 2 of the present invention is explained using FIGS. 8A to 9D. An embodiment of the formation of a bottom gate type TFT having an n-channel TFT and a p-channel TFT is explained here.

First, a glass substrate (Corning 1737, softening point 667° C.) is prepared as a substrate 801. A nitrated silicon oxide film 850 is then formed with a film thickness of 100 to 300 nm as a base film in order to increase the TFT electrical characteristics by preventing diffusion of contaminating impurities from the substrate.

An example is shown here in which the nitrated silicon oxide film is formed on only one face of the substrate, but it is effective to form the film on both surfaces of the substrate, not only one. By forming the base film on both substrate surfaces, diffusion of contaminating impurities such as sodium from the substrate at the time of manufacture of a semiconductor device can be completely blocked. In addition, it is even more effective to cover all substrate surfaces by the base film.

A gate wiring (including a gate electrode) 802 is then formed with a laminate structure (for brevity, this is not shown in the figures) on the base film 850. A tantalum nitride film (film thickness 50 nm) and a tantalum film (film thickness 250 nm) are laminated by using sputtering in Embodiment 2, and the gate wiring (including a gate electrode) having a laminate structure is formed using the know patterning technique of photolithography. (See FIG. 8A)

Removal of contaminating impurities 860 from the surface of the base film 850 and from the surface of the gate wiring 802 is performed next. The removal of the contaminating impurity 860 is performed by a scattering means (also called spin etching and spin etch) using a spinner device (spin etcher) to spin the substrate at 600 rpm for 10 seconds, scattering an acidic solution containing fluorine which is dripped onto the film surface and brought into contact therewith. A buffered hydrofluoric acid (BHF) solution of hydrofluoric acid and ammonium fluoride at a mixture ratio of 1:50 by volume is used here as the acidic solution containing fluorine. By using spin etching, an extremely thin film can be removed, and contamination of the film surface by contaminated acid solution can be prevented. Note that appropriate optimal settings for the conditions such as rotation rate of the spinner device and spin time may be found in accordance with the substrate surface area, etching solution concentration, and film material. Further, 1:50 BHF is used as the etching solution, but other acid solution containing fluorine such as BHF with a different mixture ratio and FPM can also be used. (See FIG. 8B)

After removal of the contaminating impurities from the surface of the surface of the base film 850 and from the surface of the gate wiring 802, a gate insulating film 803 and an amorphous semiconductor film 804 are laminated in order without exposure to the atmosphere. Note that by forming the gate insulating film 803 and the amorphous semiconductor film 804 promptly after removal of the contaminating impurities 860, a low contaminating impurity concentration in the interface between the gate wiring 802 and the gate insulating film 803 can be maintained, with a value of $2\times10^{16}$ atoms/cm$^3$ or less.

The gate insulating film 803 is made into a laminate structure gate insulating film in Embodiment 2 for reliability considerations, in which a silicon nitride film 803a (film thickness 50 nm) and a silicon oxide film 803b (film thickness 125 nm) are laminated by plasma CVD. A two-layer insulating film is employed as the gate insulating film in Embodiment 2, but a single layer structure, or a laminate structure with three or more layers may also be used. Further, an amorphous silicon film is formed by plasma CVD and with a film thickness of 54 nm on the gate insulating film as the amorphous semiconductor film 804 in Embodiment 2. Note that the films are fowled one after another without exposure to the atmosphere so that contaminating matter from the atmosphere does not adhere to the interface of both films. Heat treatment is performed next (at 500° C. for 1 hour) in order to reduce the concentration of hydrogen, which impedes semiconductor film crystallization, within the amorphous semiconductor film. (See FIG. 8C)

Figure 8A:
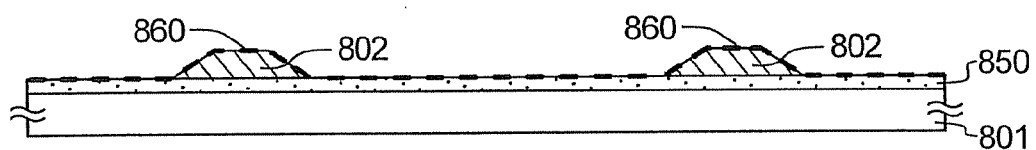
FIGS. 8A to 8D are diagrams showing a process of manufacturing a TFT according to Embodiment 2.
Figure 8B:
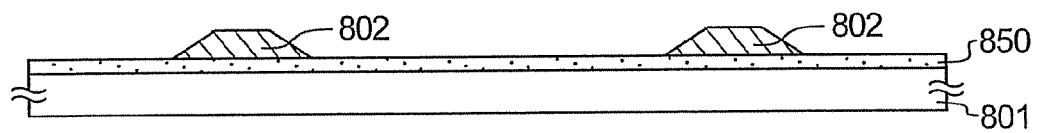
Figure 8C:
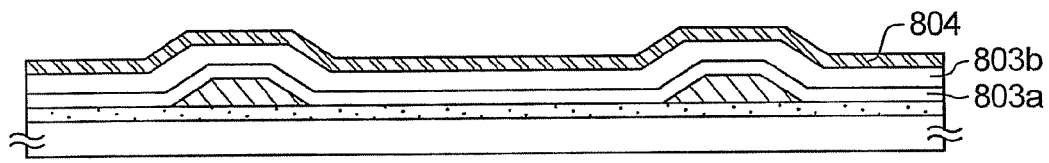
Figure 8D:
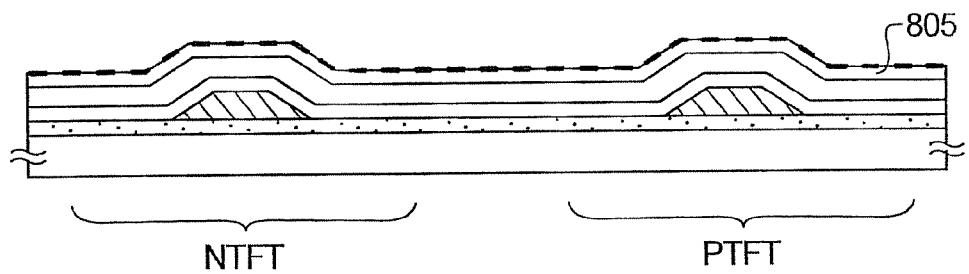

After the state of FIG. 8C is obtained, crystallization (laser crystallization) of the amorphous semiconductor film 804 is performed by irradiation of infrared light or ultraviolet light (laser annealing), forming a crystalline semiconductor film (a semiconductor film containing crystals) 805. When using ultraviolet light as the crystallization technique, excimer laser light or the strong light emitted from an ultraviolet lamp may be used. If infrared light is used as the crystallization technique, infrared laser light or the strong light emitted from an infrared lamp may be used. A linear shape beam of KrF excimer laser light is irradiated in Embodiment 2. Note that the irradiation conditions are: a pulse frequency of 30 Hz; an overlap ratio of 96%; and a laser energy density of 100 to 500 mJ/cm$^2$ (typically between 200 and 300 mJ/cm$^2$). In Embodiment 2, 360 mJ/cm$^2$ is used. Note also that the laser crystallization conditions (such as laser light wavelength, overlap ratio, irradiation strength, pulse width, frequency of repetition, and time of irradiation) may be appropriately set by the operator by considering the film thickness of the amorphous semiconductor film 804 and the substrate temperature. Depending upon the laser crystallization conditions, there are cases when the semiconductor film is melted and then crystallized, and there are cases when the semiconductor film is not melted, but crystallized in a solid state or an intermediate state between a solid state and a liquid state. The amorphous semiconductor film 804 is crystallized by this process, forming the crystalline semiconductor film 805. The crystalline semiconductor film is a polycrystalline silicon film (polysilicon film) in Embodiment 2. Note that a laser crystallization technique is used in Embodiment 2, but crystallization may also be performed by using a thermal crystallization technique which uses a catalytic element.

Further, in manufacturing the crystalline semiconductor film by the laser crystallization method, a pulse emission type or a continuous emission type excimer laser, or a solid state laser such as a YAG laser, a YVO$_4$ laser, a YLF laser, or a YAlO$_3$ laser can be used. If a laser diode excitation method is used for these solid state lasers, then high output, high repeatability frequency can be realized. The second harmonic (532 nm), the third harmonic (355 nm), and the fourth harmonic (266 nm) of a YAG laser, a YVO$_4$ laser, a YLF laser, or a YAlO$_3$ laser can be used. Roughly speaking. for cases in which laser light with a wavelength of 400 nm or greater is irradiated, the inside of the semiconductor film is heated by the overlap with the light penetration depth, and crystallization can occur. On the other hand, with wavelengths of less than 400 nm, heating is carried out from the semiconductor film surface and crystallization can occur. Whichever is used, crystallization is performed with an appropriate number of emission pulses and emission energy density.

When using a laser, a method may be used in which the laser light emitted from a laser emission device is condensed into a linear shape and then irradiated to the semiconductor film. The crystallization conditions are appropriately selected by the operator, but if a YAG laser is used, then the second harmonic is used and the pulse emission frequency is set to between 1 and 10 kHz, and the laser energy density may be from 300 to 600 mJ/cm$^2$ (typically between 350 and 500 mJ/cm$^2$). Laser light which has been condensed into a linear shape with a width of 100 to 1000 μm, for example 400 μm, is then irradiated on the entire substrate surface, and irradiation is performed with the overlap ratio of the linear shape laser light between 80 and 98% at this point.

Next, a valence electron control impurity element doping process is performed in the crystalline semiconductor film 805 thus formed. After a valence electron control impurity activation process is performed, heat treatment is performed in a hydrogen atmosphere (at 350° C. for 1 hour), hydrogenating the entire substrate body. Note that hydrogenation is performed by using heat treatment in Embodiment 2, but hydrogenation may also be performed by using a plasma hydrogenation process. Island shape semiconductor films are formed next by a known patterning technique as an active layer having a desired shape.

A source region 815, a drain region 816, low concentration valence electron control impurity regions 817 and 818 in which the valence electron control impurity is doped at between $1 \times 10^{16}$ and $1 \times 10^{19}$ atoms/cm$^3$, and a channel forming region 819 are thus formed through the above processes in the n-channel TFT, and a source region 821, a drain region 822, and a channel forming region 820 are thus formed in the p-channel TFT. The low concentration valence electron control impurity regions 817 and 818 of the n-channel type TFT are each formed here with a region (GOLD region) which overlaps the gate electrode, and with a region (LDD region) which does not overlap the gate electrode, when seen from above. (See FIG. 9A)

Removal of contaminating impurities 861 is carried out from the surface of the island shape semiconductor films. Similar to the contaminating impurity removal from the surface of the base film 850 and from the surface of the gate wiring 802, the contaminating impurity 861 is removed by spin etching using BHF as the acidic solution containing fluorine. An extremely thin film can be removed, and contamination of the film surface by contaminated acid solution can be prevented. Other fluorine containing acidic solutions such as FPM can also be used here as the etching solution. (See FIG. 9B)

An interlayer insulating film 823 with a laminate structure of a silicon oxide film with a 100 nm film thickness formed by plasma CVD and a silicon oxide film with a film thickness of 940 nm formed by using TEOS and oxygen (O$_2$) as raw material gasses, is formed, covering the island shaped semiconductor films from which the contaminating impurities have been removed. Note that by forming the interlayer insulating film 823 promptly after removal of the contaminating impurity 861, a low contaminating impurity concentration in the interface between the island shape semiconductor films and the interlayer insulating film 823 can be maintained, with a value of $2 \times 10^{16}$ atoms/cm$^3$ or less. (See FIG. 9C.)

Figure 9A:
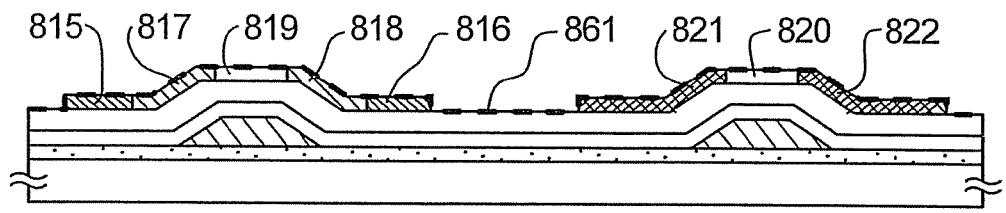
FIGS. 9A to 9D are diagrams showing the process of manufacturing the TFT according to 2.
Figure 9B:
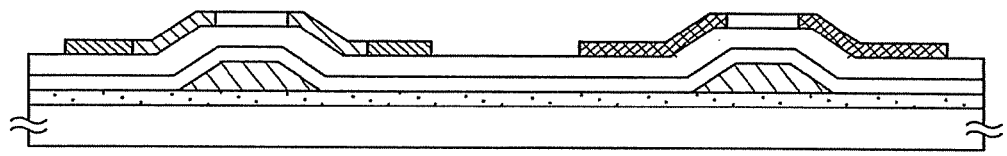
Figure 9C:
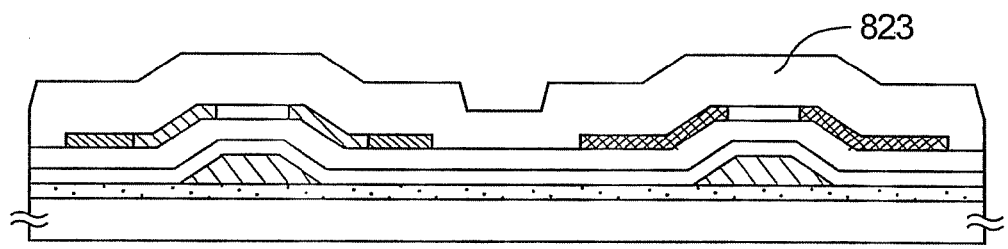
Figure 9D:
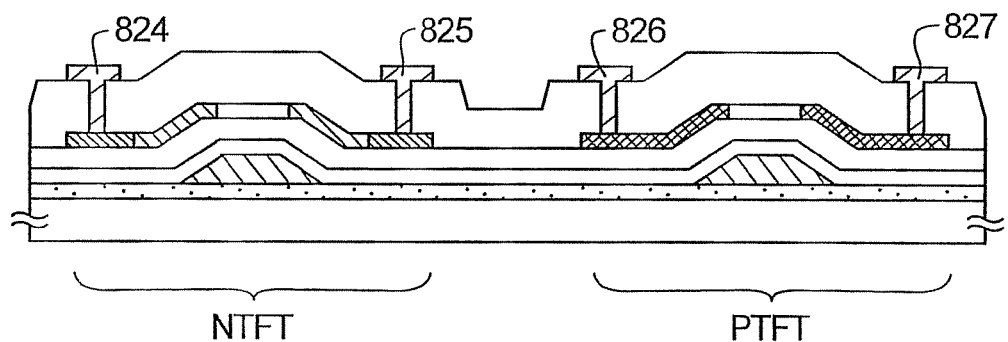

Contact holes are then formed, source wirings 824 and 826, and drain wirings 825 and 827 are formed, and the state shown in FIG. 9D is obtained. Finally, heat treatment is performed in a hydrogen atmosphere, hydrogenating the entire substrate body, and completing the formation of the n-channel TFT and the p-channel TFT. This hydrogenation may be performed using a plasma hydrogenation process.

Note that the process order may be changed in Embodiment 2, and crystallization may be performed after patterning of the amorphous semiconductor film.

Further, doping of the valence electron control impurity into the amorphous semiconductor film may be performed before crystallization, and TFT threshold voltage control may also be performed.

The contaminating impurity concentration in the film interface can be reduced in Embodiment 2, and therefore the concentration of harmful contaminating impurities can be reduced to $2 \times 10^{16}$ atoms/cm$^3$ or less in SIMS analysis, and, depending upon the conditions, can be reduced to $1 \times 10^{16}$ atoms/cm$^3$ or less, or the minimum detection level or less as is currently detected taking noise into account. Therefore, dispersion in the TFT characteristics can be reduced, and the TFT reliability can be increased.

[Embodiment 3]

Figure 10:
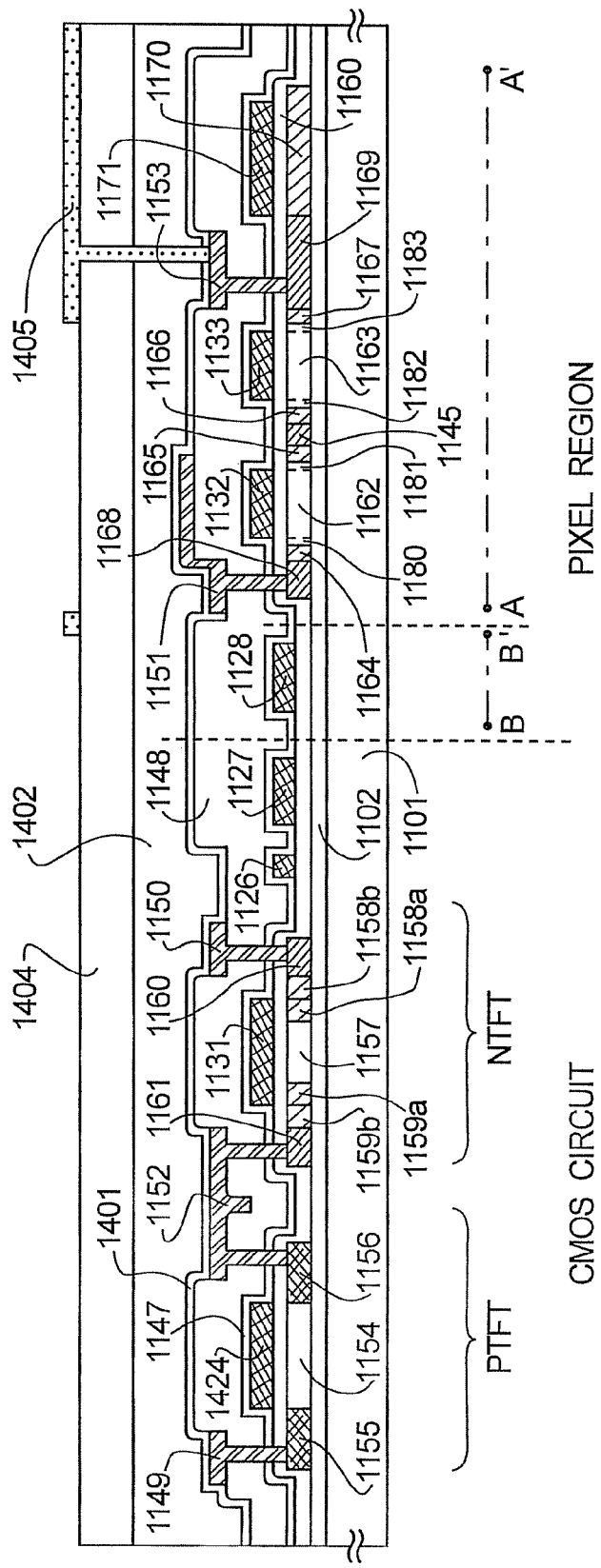
FIG. 10 is a cross sectional diagram showing a CMOS circuit and a pixel region of Embodiment 3.
Figure 11:
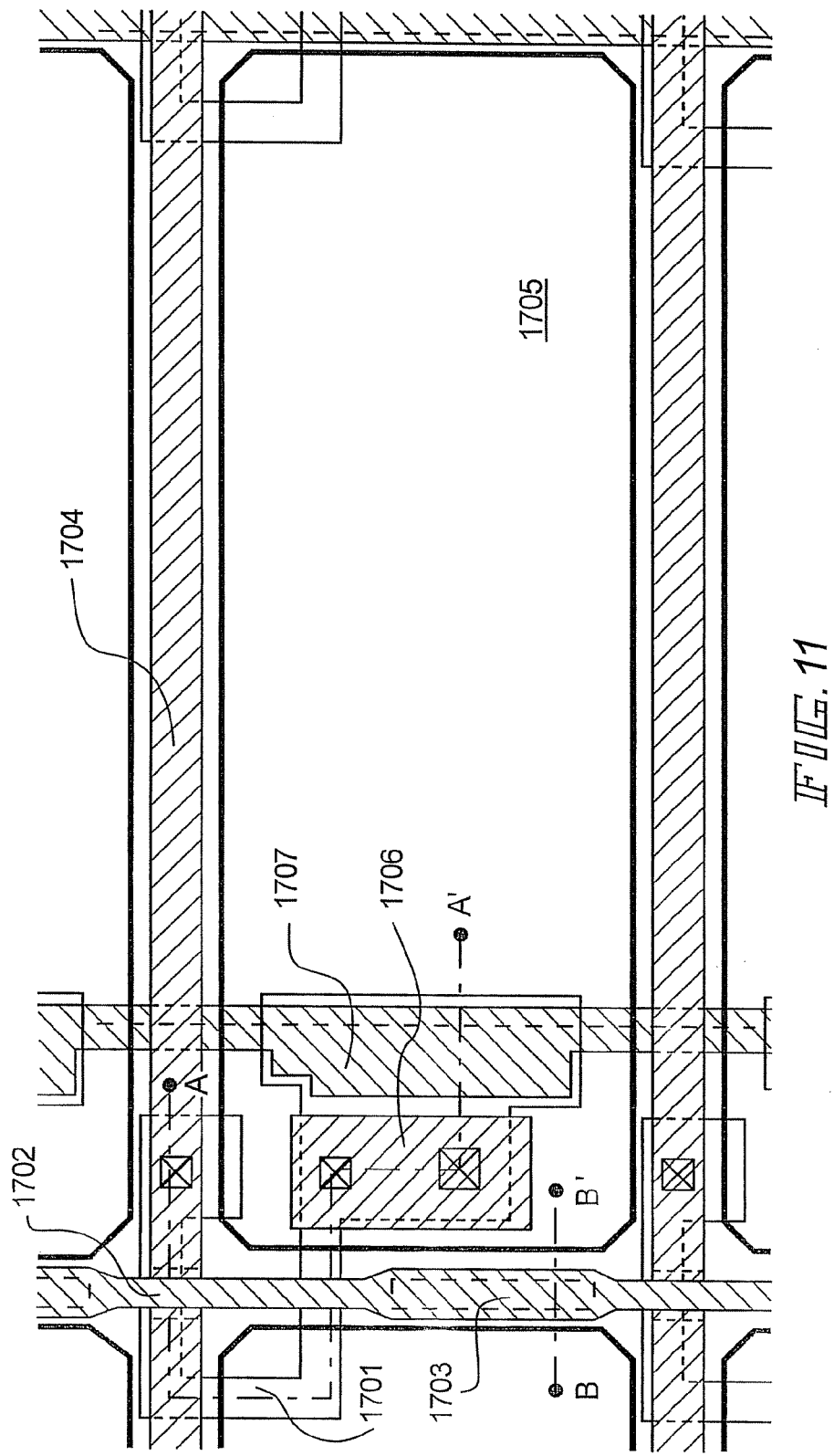
FIG. 11 is a top view of the pixel region of Embodiment 3.

In Embodiment 3, an example is shown in FIGS. 10 and 11 of a liquid crystal display device equipped with an n-type TFT and a p-type TFT manufactured in accordance with Embodiment 1 above. The semiconductor device of Embodiment 3 is equipped with a circuit in which CMOS circuits and a pixel region are arranged in a matrix state on the same substrate.

A cross sectional diagram of the semiconductor device of Embodiment 3 is shown in FIG. 10. In consideration of reliability, the TFTs are formed over a base film 1102 formed on a substrate 1101 in Embodiment 3.

The CMOS circuit shown in the left side of FIG. 10 is called an inverter circuit, and is a basic circuit structuring the semiconductor circuit. By combining these types of inverter circuits, a more complex logic circuit structure can be made.

The p-channel TFT of the CMOS circuit is formed with a channel forming region 1154, and third valence electron control impurity regions 1155 and 1156. Boron is doped at a concentration of $2 \times 10^{20}$ atoms/cm$^3$ into the third valence electron control impurity regions 1155 and 1156.

On the other hand, the n-channel TFT of the CMOS circuit is formed with a channel forming region 1157, first valence electron control impurity regions 1160 and 1161 into which phosphorous is doped at a concentration of $1 \times 10^{19}$ to $1 \times 10^{21}$ atoms/cm$^3$, and second valence electron control impurity regions 1158 and 1159. The second valence electron control impurity regions 1158 and 1159 are formed with regions (GOLD regions) 1158*a* and 1159*a*, respectively, which overlap a gate electrode 1131, and regions (LDD regions) 1158*b* and 1159*b*, respectively, which do not overlap the gate electrode 1131.

The n-channel TFT formed in the pixel region is formed with channel forming regions 1162 and 1163, first valence electron control impurity regions 1168, 1169, and 1145, second valence electron control impurity regions 1164 to 1167, and offset regions 1180 to 1183. The first valence electron control impurity regions are regions doped with phosphorous at a concentration of $1 \times 10^{19}$ to $1 \times 10^{21}$ atoms/cm$^3$, and the second valence electron control impurity regions are low concentration regions in which the valence electron control impurity concentration is lower than that of the first valence electron control impurity regions. Phosphorous is doped into the second valence electron control impurity regions at a concentration of $1 \times 10^{16}$ to $1 \times 10^{19}$ atoms/cm$^3$. A multi-gate structure is employed in the pixel region in order to reduce dispersion in the off current, and an offset structure is employed in order to reduce the leak current. The structure is therefore one in which the second valence electron control impurity regions do not overlap the gate electrode. In the drain side, a low concentration valence electron control impurity region 1170, a gate insulating film 1160, and a storage capacitor electrode 1171 doped with a valence electron control impurity element which imparts n-type conductivity at the same concentration as in the second valence electron control impurity regions are formed, and a storage capacitor formed in the pixel region is formed.

First interlayer insulating films 1147 (a silicon nitride film with a thickness of 50 nm) and 1148 (a silicon oxide film with a thickness of 950 nm), source electrodes 1149 to 1151, drain electrodes 1152 and 1153, a passivation film 1401 (a silicon nitride film with a thickness of 50 nm), a second interlayer insulating film 1402 (an organic resin film with a thickness of 1000 nm), a third interlayer insulating film 1404, and a pixel electrode 1405 (an indium tin oxide (ITO) film with a thickness of 100 nm) are then formed.

Materials such as polyimide, acrylic, and polyimide amine can be used as the organic resin film used in the second interlayer insulating film 1402. The following can be given as the advantages of using an organic resin film: simple deposition method; the reduced parasitic capacity because the specific dielectric constant is low; and superior levelness. Note that organic resin films other than those stated above can also be used. A polyimide which is thermally polymerized after application to the substrate is used here.

FIG. 11 is a top view of the pixel region, and is a top view of approximately one pixel. N-channel TFTs are formed in the pixel region. A gate electrode 1702 formed successively with a gate wiring 1703 intersects, through a gate insulating film not shown in the figures, with a semiconductor layer 1701 below the gate insulating film. A source region, a drain region, and a first valence electron control impurity region are formed in the semiconductor layer, although not shown in the figures. Further, a storage capacitor 1707 is formed in the drain side of the pixel TFT from the semiconductor layer, the gate insulating film, and an electrode made from the same material as the gate electrode. Furthermore, the cross sectional structures shown in FIG. 11 taken along the lines A-A' and B-B' correspond to those in the cross sectional diagram of the pixel region shown in FIG. 10.

A double gate structure is used for the pixel TFT in Embodiment 3, but a single gate structure may also be used in order to increase the aperture ratio, and a multi-gate structure such as a triple gate structure may also be used in order to reduce dispersions in the off current. The structure of the active matrix substrate of Embodiment 3 is not limited on the structure shown in Embodiment 3. The structure of the present invention is characterized by a gate electrode structure, and a source region, a drain region, and other valence electron control impurity regions formed in a semiconductor layer formed through a gate insulating film. Other structure may be suitably determined by the operator.

Furthermore, a transmission type LCD is manufactured as one example in Embodiment 3, but there are no limitations placed on this. For example, it is possible to manufacture a reflective type LCD by using a metallic material having reflecting characteristics as the pixel electrode material, and then by suitably changing the pixel electrode patterning or adding/eliminating some of the processing steps.

Note that the manufacture method of Embodiment 1 is employed in Embodiment 3, and therefore the contaminating impurity concentration (Na concentration) in the interface between the semiconductor film and the gate insulating film 1160, and in the interfaces between the gate insulating film 1160, the gate electrode, the gate wiring, the gate bus line, and the storage capacitor electrodes can be reduced. The contaminating impurity concentration in each of the film interfaces can be reduced to $2 \times 10^{16}$ atoms/cm$^3$ or less in SIMS analysis, and depending upon the conditions, can be reduced to $1 \times 10^{16}$ atoms/cm$^3$ or less, or the minimum detection level or less as is currently detected taking noise into account. Note that by combining the manufacture method of Embodiment 2, the contaminating impurity removal process can be applied to other film interfaces in which it is necessary to reduce the contaminating impurity concentration. Dispersion in the TFT characteristics can be reduced, and the TFT reliability can be increased, in Embodiment 3.

[Embodiment 4]

Figure 12:
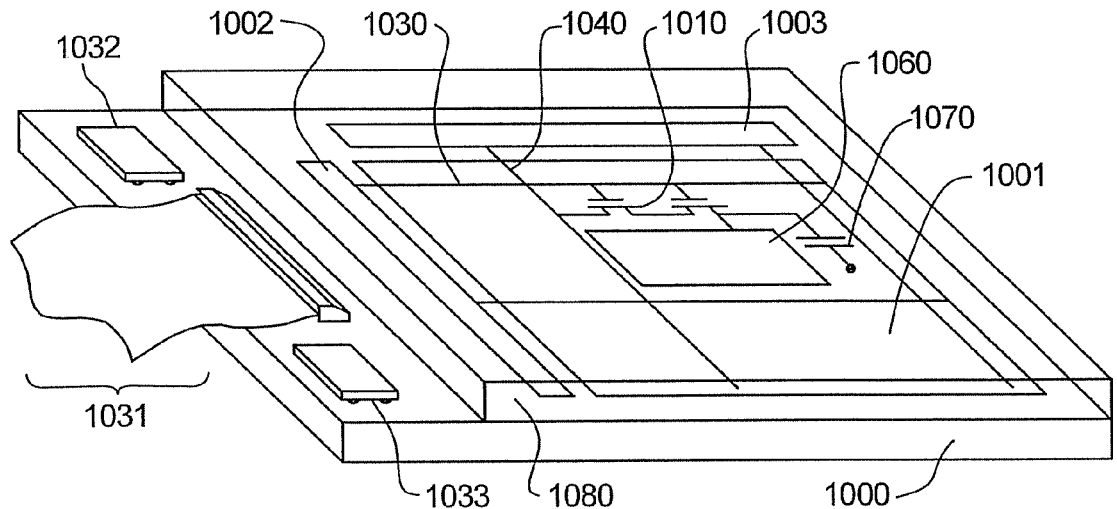
FIG. 12 is a perspective view showing an active matrix substrate of Embodiment 4.

In Embodiment 4, an example of a liquid crystal display device manufactured in accordance with the present invention is shown in FIG. 12. Known pixel TFT (pixel switching element) manufacturing methods and known means of cell assembling may be used, so a detailed explanation of those areas is omitted.

FIG. 12 is a schematic diagram of an active matrix type liquid crystal panel of Embodiment 4. As shown in FIG. 12, an active matrix substrate and an opposing substrate face each other, and a liquid crystal is sandwiched between the substrates. The active matrix substrate has a pixel region 1001, a scanning line driver circuit 1002, and a signal line driver circuit 1003 formed over a glass substrate 1000.

The scanning line driver circuit 1002 and the signal line driver circuit 1003 are connected to the pixel region 1001 by a scanning line 1030 and a signal line 1040, respectively. The driver circuits 1002 and 1003 are mainly structured by CMOS circuits.

The scanning line 1030 is formed for each row of the pixel region 1001, and the signal line 1040 is formed for each column. A pixel TFT 810 is formed near the intersection of the scanning line 1030 and the signal line 1040. A gate electrode of a pixel TFT 1010 is connected to the scanning line 1030, and a source thereof is connected to the signal line 1040. In addition, a pixel electrode 1060 and a storage capacitor 1070 are connected to a drain of the gate electrode.

An opposing substrate 1080 is a glass substrate in which a transparent conductive film such as an ITO film is formed over the entire surface. The transparent conductive film is an opposing electrode for the pixel electrode 1060 of the pixel region 1001, and drives the liquid crystal material in accordance with an electric field formed between the pixel electrode and the opposing electrode. If necessary, an orientation film, a black matrix, and a color filter are formed in the opposing substrate 1080.

IC chips 1032 and 1033 are attached on the face of the glass substrate of the active matrix substrate side in which an FPC 1031 is attached. The IC chips 1032 and 1033 are structured by forming circuits such as a video signal process circuit, a timing pulse generator circuit, a γ compensation circuit, a memory circuit, or an arithmetic circuit on a silicon substrate.

Further, liquid crystal display devices which can be manufactured using the present invention can be either transmitting type or reflecting type. The operator may freely select which type. It is thus possible to apply the present invention for all kinds of active matrix type electrooptical device (semiconductor device).

Note that in manufacturing the semiconductor device shown in Embodiment 4, the constitutions of Embodiments 1 to 3 may be employed, and that it is possible to freely combine the Embodiments.

[Embodiment 5]

It is possible to apply the present invention to an active matrix type EL display device. An example is shown in FIG. 13.

Figure 13:
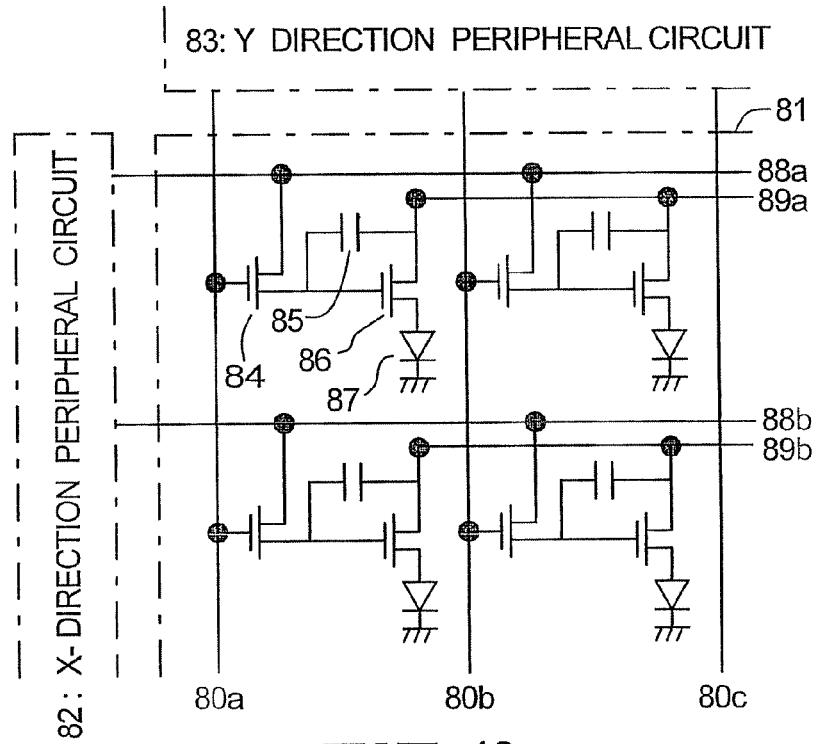
FIG. 13 is a circuit diagram of the EL panel of Embodiment 5.

FIG. 13 is a circuit diagram of an active matrix type EL display device. Reference numeral 81 denotes a display region, and an x-direction peripheral driver circuit 82 and a y-direction peripheral driver circuit 83 are formed in the periphery of the display region 81. Further, each pixel of the display region 81 has a switching TFT 84, a capacitor 85, a current control TFT 86, and an organic EL element 87. An x-direction signal line 88a (or 88b) and a y-direction signal line 80a (or 80b or 80c) are connected to the switching TFT 84. In addition, power source lines 89a and 89b are connected to the current control TFT 86.

Note that the constitution of any of Embodiments 1 to 3 may be combined with the active matrix type EL display device of Embodiment 5.

[Embodiment 6]

It is possible to apply the present invention to all general convention IC technology. In other words, the present invention can be applied to all semiconductor circuits currently distributed in the marketplace. For example, the present invention may be applied to microprocessors such as a RISC processor or an ASIC processor integrated on one chip, and it may be applied to signal processing circuits, typically liquid crystal driver circuits (such as a D/A converter, a γ compensation circuit, or a signal divider circuit), and to high frequency circuits used in portable equipment (such as a mobile telephone, a PHS, or a mobile computer).

Furthermore, semiconductor circuits such as a microprocessor are loaded into many kinds of electronic equipment, and function as the nerve center circuit. Personal computers, portable information terminals, and all household appliances can be given as typical electronic equipment. Further, computers for controlling an vehicle (such as an automobile or train) can also be given. It is possible to apply the present invention to semiconductor devices such as these.

[Embodiment 7]

A CMOS circuit and a pixel matrix circuit formed through carrying out the present invention may be applied to various electrooptical devices (active matrix type liquid crystal displays, active matrix type EL displays, active matrix type EC displays). Namely, the present invention may be embodied in all the electronic equipments that incorporate those electrooptical devices into display units.

As such an electronic equipment, a video camera, a digital camera, a projector (rear-type or front-type projector), a head mount display (goggle-type display), a navigation system for vehicles, a stereo for vehicles, a personal computer, and a portable information terminal (a mobile computer, a cellular phone, or an electronic book, etc.) may be enumerated. Examples of those are shown in FIGS. 14A to 16C.

Figure 14A:
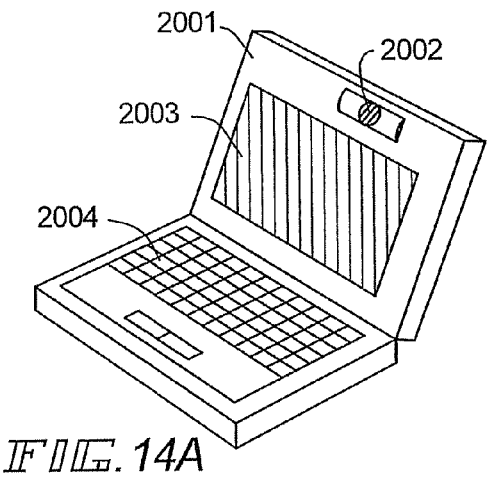
FIGS. 14A to 14F are diagrams showing various semiconductor devices in Embodiment 7.

FIG. 14A shows a personal computer comprising a main body 2001, an image inputting unit 2002, a display unit 2003, and a key board 2004 and the like. The present invention is applicable to the image inputting unit 2002, the display unit 2003, and other signal control circuits.

Figure 14B:
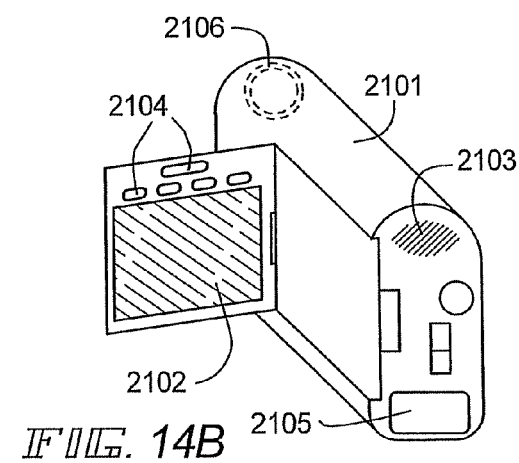

FIG. 14B shows a video camera comprising a main body 2101, a display unit 2102, a voice input unit 2103, operation switches 2104, a battery 2105, and an image receiving unit 2106 and the like. The present invention is applicable to the display unit 2102 and other signal control circuits.

Figure 14C:
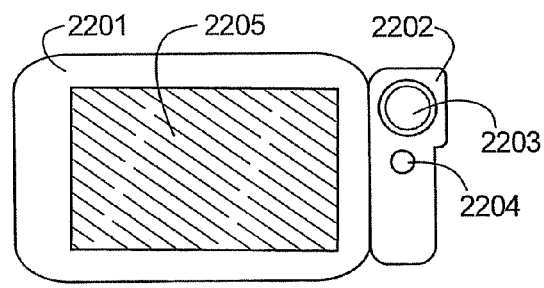

FIG. 14C shows a mobile computer comprising a main body 2201, a camera unit 2202, an image receiving unit 2203, an operation switch 2204, and a display unit to 2205 and the like. The present invention is applicable to the display unit 2205 and other signal control circuits.

Figure 14D:
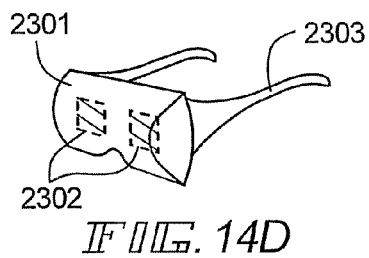

FIG. 14D shows a goggle-type display comprising a main body 2301, a display unit 2302 and arm portions 2303 and the like. The present invention is applicable to the display unit 2302 and other signal control circuits.

Figure 14E:
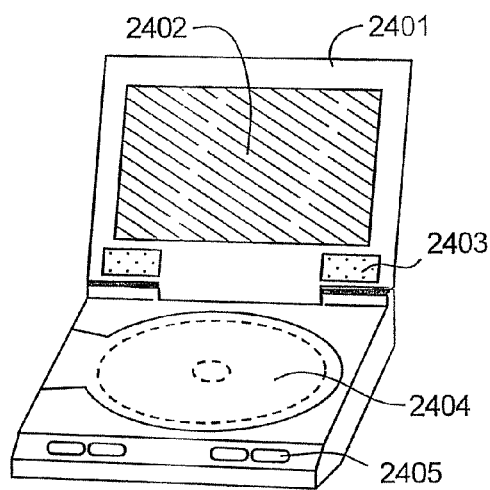

FIG. 14E shows a player that employs a recoding medium in which programs are recorded (hereinafter referred to as recording medium), and comprises a main body 2401, a display unit 2402, a speaker unit 2403, a recording medium 2404, and an operation switch 2405 and the like. Incidentally, this player uses as the recoding medium a DVD (digital versatile disc), a CD and the like to serve as a tool for enjoying music or movies, for playing video games and for connecting to the Internet. The present invention is applicable to the display unit 2402 and other signal control circuits.

Figure 14F:
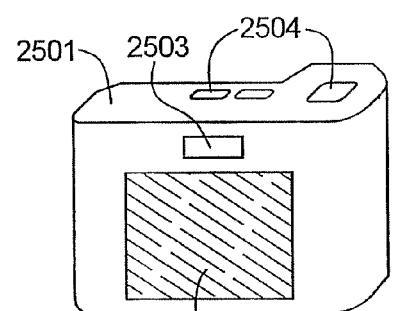

FIG. 14F shows a digital camera comprising a main body 2501, a display unit 2502, an eye piece section 2503, operation switches 2504, and an image receiving unit (not shown) and the like. The present invention is applicable to the display unit 2502 and other signal control circuits.

Figure 15A:
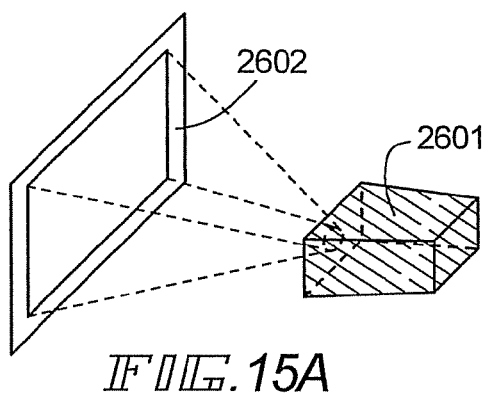
FIGS. 15A to 15D are diagrams showing various semiconductor devices in Embodiment 7.

FIG. 15A shows a front-type projector comprising a projection device 2601, a screen 2602 and the like. The present invention is applicable to a liquid crystal display device 2808 that constitutes a part of the projection device 2601 and other signal control circuits.

Figure 15B:
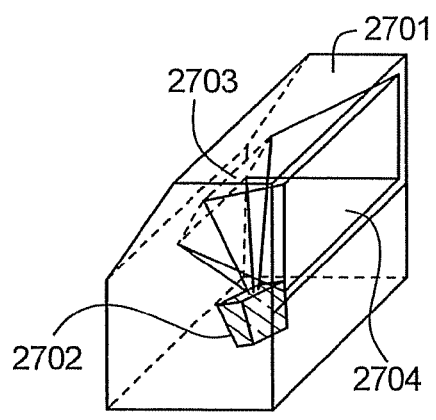

FIG. 15B shows a rear-type projector comprising a main body 2701, a projection device 2702, a mirror 2703, and a screen 2704 and the like. The present invention is applicable to the liquid crystal display device 2808 that constitutes a part of the projection device 2702 and other signal control circuits.

Figure 15C:
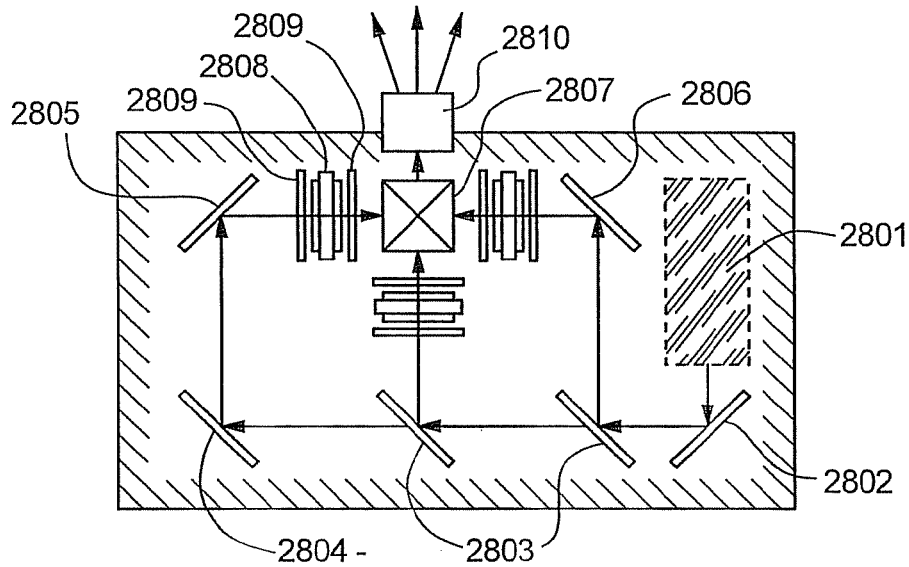

FIG. 15C is a diagram showing an example of the structure of the projection devices 2601 and 2702 in FIGS. 15A and 15B. The projection device 2601 or 2702 comprises a light source optical system 2801, mirrors 2802 and 2804 to 2806, dichroic mirrors 2803, a prism 2807, liquid crystal display devices 2808, phase difference plates 2809, and a projection optical system 2810. The projection optical system 2810 consists of an optical system including a projection lens. This embodiment shows an example of "three plate type", but not particularly limited thereto. For instance, the invention may be applied also to "single plate type". Further, in the light path indicated by an arrow in FIG. 15C, an optical system such as an optical lens, a film having a polarization function, a film for adjusting a phase difference and an IR film may be provided on discretion of a person who carries out the invention.

Figure 15D:
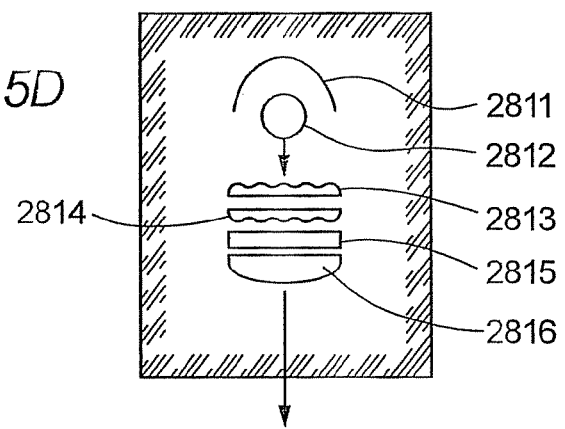

FIG. 15D is a diagram showing an example of the structure of the light source optical system 2801 in FIG. 15C. In this embodiment, the light source optical system 2801 comprises a reflector 2811, light source 2812, lens arrays 2813 and 2814, a polarization conversion element 2815, and a condenser lens 2816. The light source optical system shown in FIG. 15D is an example thereof, and is not particularly limited. For instance, on discretion of a person who carries out the invention, the light source optical system may be provided with an optical system such as an optical lens, a film having a polarization function, a film for adjusting the phase difference and an IR film.

The projector shown in FIG. 15 shows the case in which the electrooptical device of transmission type is employed and an application example using the electrooptical device of reflective type and the EL display device is not illustrated.

Figure 16A:
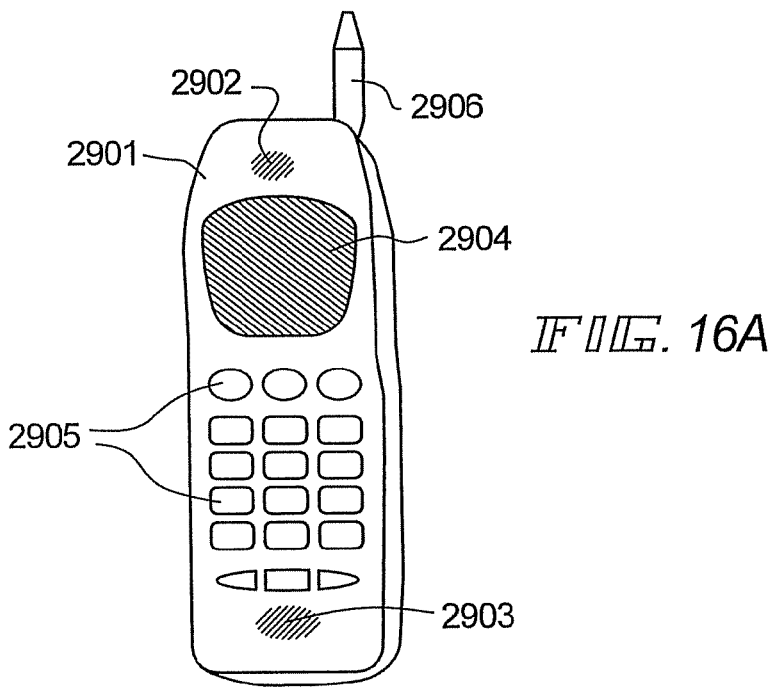
FIGS. 16A to 16C are diagrams showing various semiconductor devices in Embodiment 7.

FIG. 16A is a cellular phone that is composed of a main body 2901, a voice output unit 2902, a voice input unit 2903, a display unit 2904, operation switches 2905, and an antenna 2906 and the like. The present invention can be applied to the voice output unit 2902, the voice input unit 2903 and the display unit 2904 and other signal control circuits.

Figure 16B:
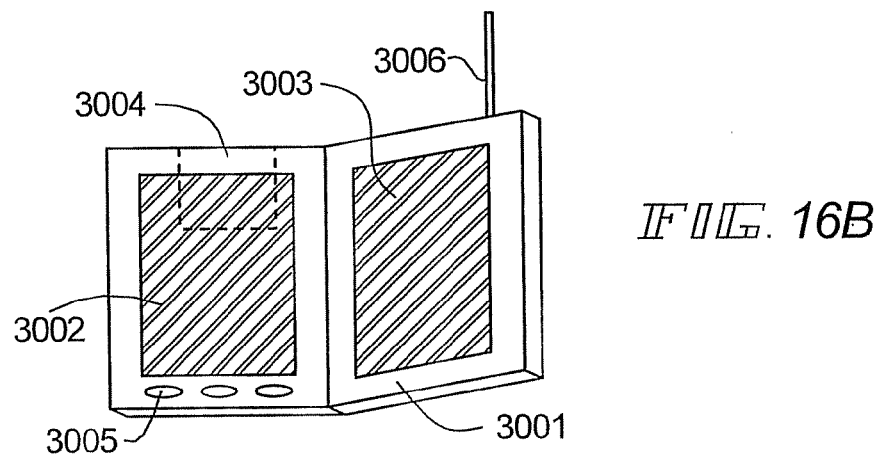

FIG. 16B shows a portable book (electronic book) that is comprised of a main body 3001, display units 3002 and 3003, a memory medium 3004, an operation switch 3005 and an antenna 3006 and the like. The present invention can be applied to the display units 3002 and 3003 and other signal circuits.

Figure 16C:
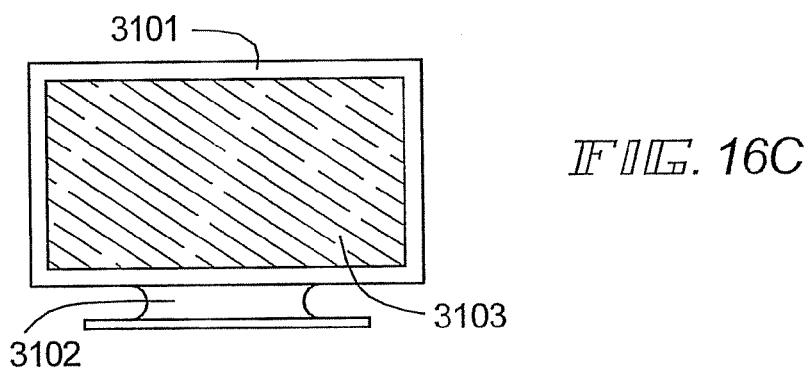

FIG. 16C shows a display that is comprised of a main body 3101, a support base 3102 and a display unit 3103 and the like. The present invention can be applied to the display unit 3103. The display according to the present invention is advantageous in the case where the display is particularly large-sized and in the case where the display is 10 inches or more in an opposite angle (particularly 30 inches or more).

As described above, the present invention has so wide application range that it is applicable to electronic equipments in any field. In addition, the electronic equipments of this embodiment may be realized with any construction obtained by combining Embodiments 1 through 6.

[Embodiment 8]

Figure 17A:
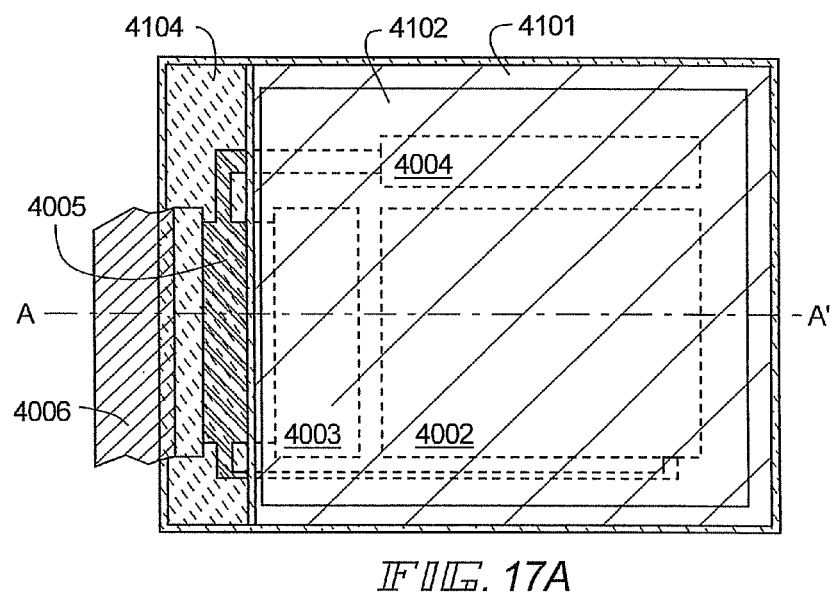
FIGS. 17A and 17B are a top view and a cross sectional diagram, respectively, of an EL display device of Embodiment 8.

An explanation of an example of the manufacture of an active matrix type EL (electro-luminescence) display device using the present invention is given in Embodiment 8. FIG. 17A is a top view of an EL display device using the present invention, and FIG. 17B is its cross sectional diagram.

In FIG. 17A reference numeral 4001 denotes a substrate, 4002 denotes a pixel region, 4003 denotes a source side driver circuit, and 4004 denotes a gate side driver circuit. Each of the drive circuits is lead to an FPC (flexible printed circuit) 4006 through a wiring 4005, and thus connected to external equipment.

A first sealing material 4101, a covering material 4102, a filling material 4103, and a second sealing material 4104 are formed at this point, surrounding the pixel region 4002, the source side driver circuit 4003, and the gate side driver circuit 4004.

Figure 17B:
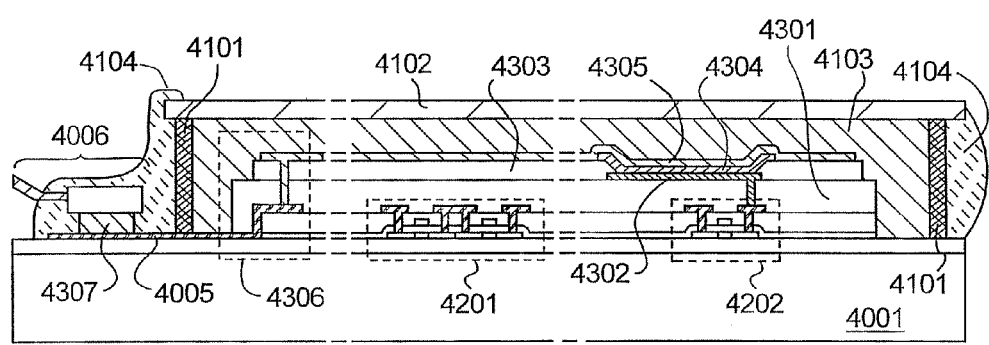

In addition, FIG. 17B corresponds to the cross sectional structure of the EL display device of FIG. 17A cut along the line A-A'. A driver TFT (however, a CMOS circuit combining an n-channel type TFT and a p-channel type TFT is shown here) 4201 contained in the source side driver circuit 4003, and a pixel TFT (however, a TFT for controlling the current to an EL element is shown here) 4202 contained in the pixel region 4002, are formed over the substrate 4001.

A TFT with the same structure as the CMOS circuit of FIG. 10 is used in Embodiment 8 in the driver TFT 4201. Further, a TFT with the same structure as the pixel region of FIG. 10 is used in the pixel TFT 4202.

An interlayer insulating film (planarizing film) 4301 comprises resin material on the driver TFT 4201 and on the pixel TFT 4202, and a pixel electrode (cathode) 4302 for electrically connecting to the drain of the pixel TFT 4202 is formed on top. A conductive film having light shielding characteristics (typically a conductive film having aluminum, copper, or silver as its principal constituent, or a laminate film of these films) can be used as the pixel electrode 4302. An aluminum alloy is used as the pixel electrode in Embodiment 8.

An insulating film 4303 is then formed on the pixel electrode 4302, and an open section is formed in the insulating film 4303 over the pixel electrode 4302. An EL (electroluminescence) layer 4304 is formed on the pixel electrode 4302 in the open section. Known organic EL materials or inorganic EL materials can be used as the EL layer 4304. Further, low molecular weight materials (monomers) and high molecular weight materials (polymers) exist as organic EL materials, and either may be used.

A known technique may be used as the formation method of the EL layer 4304. Further, the structure of the EL layer may be a single layer structure, or a laminate structure of the following freely combined: hole injection layer, hole transport layer, light emitting layer, electron transport layer, electron injection layer.

An anode 4305 is formed from a transparent conductive film on the EL layer 4304. A compound material of indium oxide and tin oxide, or a compound material of indium oxide and zinc oxide can be used as the transparent conductive film. It is preferable to remove as much as possible of the moisture and oxygen existing in the interface between the anode 4305 and the EL layer 4304. Therefore, it is necessary to form the EL layer 4304 and the anode 4305 inside a vacuum by successive film deposition, or to form the EL layer 4304 in a nitrogen or rare gas atmosphere and then form the anode 4305 without exposure to oxygen and moisture. It is possible to perform the above film deposition in Embodiment 8 by using a multi-chamber system (cluster tool system) film deposition device.

In a region denoted by reference numeral 4306, the anode 4305 is electrically connected to the wiring 4005. The wiring 4005 is a wiring to impart a given voltage to the anode 4305, and is electrically connected to the FPC 4006 through a conductive material 4307.

The EL element made up of the pixel electrode (cathode) 4302, the EL layer 4304, and the anode 4305 is thus formed as above. The EL element is surrounded by the covering material 4102 attached to the substrate 4001 by the first sealing material 4101 and the second sealing material 4104, and is then sealed up by the filling material 4103.

A glass plate, an FRP (fiberglass-reinforced plastic) plate, a PVF (polyvinyl fluoride) film, a Mylar film, a polyester film, and an acrylic film can be used as the covering material 4102. In the case of Embodiment 8, the light emission direction from the EL element is toward the covering material 4102, and therefore a material with light transmitting characteristics is used.

However, it is not necessary to use a material with light transmitting characteristics for cases in which the light emission direction from the EL element is in the opposite direction from the covering material. A metallic plate (typically a stainless steel plate), a ceramic plate, or a sheet having a structure in which an aluminum foil is sandwiched by PVF films or Mylar films can be used.

An ultraviolet cured resin or a thermally curable resin can be used as the filling material 4103, and PVC (polyvinyl chloride), acrylic, polyimide, epoxy resin, silicon resin, PVB (polyvinyl butyral), or EVA (ethylene vinyl acetate) can be used. If a substance absorbing moisture (preferably barium oxide) is placed on the inside of the filling material 4103, then degradation of the EL element may be suppressed, and this is preferable. Note that a transparent material is used in Embodiment 8 so that light from the EL element can pass through the filling material 4103.

Further, spacers may be included within the filling material 4103. The spacers may be formed from barium oxide, giving the spacers themselves the ability to absorb moisture. Furthermore, when spacers are formed, a resin film formed on the anode 4305 is effective as a buffer layer in relieving pressure from the spacers.

The wiring 4005 is electrically connected to the FPC 4006 through the conductive material 4307. The wiring 4005 transmits the signals sent from the pixel region 4002, from the source side driver circuit 4003, and from the gate side driver circuit 4004 to the FPC 4006, and an electrical connection to external equipment is provided by the FPC 4006.

Further, the second sealing material 4104 is formed to cover the exposed portion of the first sealing material 4101 and a portion of the FPC 4006 in Embodiment 8, a structure which thoroughly shields the EL element from the atmosphere. Thus the EL display device with the cross sectional structure of FIG. 17B is formed. Note that the EL display device of Embodiment 8 may be manufactured by using a combination of the constitutions of any of Embodiments 1 to 7.

[Embodiment 9]

Figure 18A:
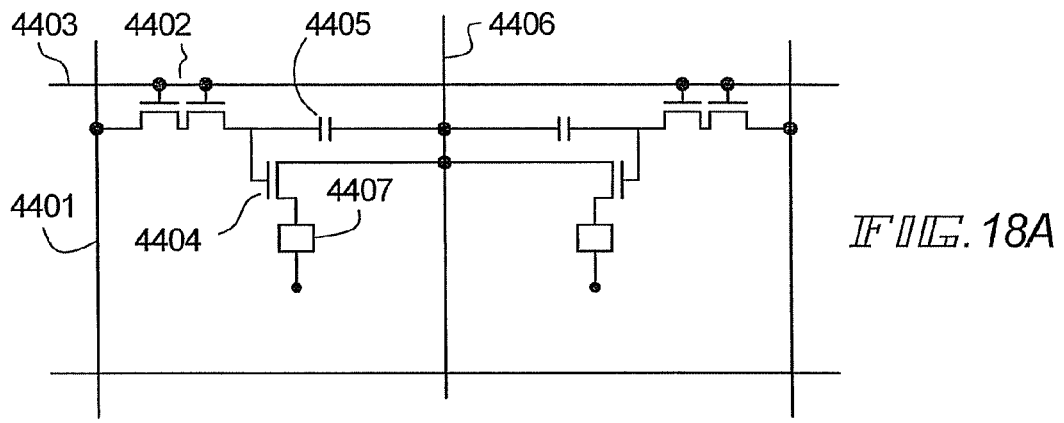
FIGS. 18A to 18C are diagrams showing the structure of a pixel region of the EL display device of Embodiment 9.
Figure 18B:
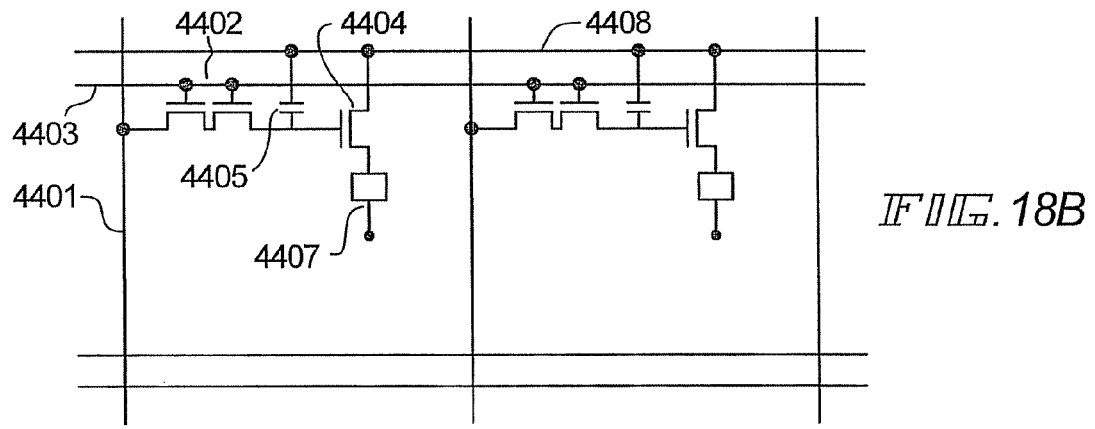
Figure 18C:
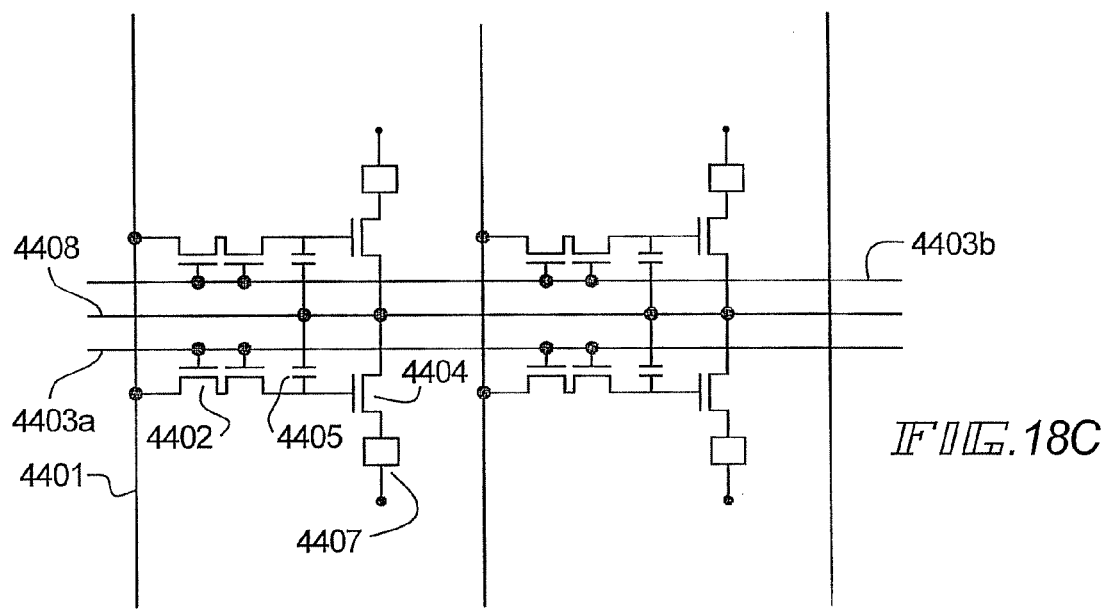

In Embodiment 9, examples of pixel structures are shown in FIG. 18A to 18C which can be used in the pixel region of the EL display device shown in Embodiment 8. Note that reference numeral 4401 denotes a source wiring of a switching TFT 4402, reference numeral 4403 denotes gate wirings of the switching TFT 4402, reference numeral 4404 denotes a current control TFT, 4405 denotes a capacitor, 4406 and 4408 denote current supply lines, and 4407 denotes an EL element.

FIG. 18A is an example of a case with the current supply line 4406 common between two pixels. In other words, this is characterized by two pixels being formed with linear symmetry around the current supply line 4408. In this case, the number of current supply lines can be reduced, and therefore the pixel region can be made even higher definition.

In addition, FIG. 18B is an example of a case with the current supply line 4408 formed parallel to the gate wirings 4403. Note that the structure of FIG. 18B is one in which the current supply line 4408 is formed so as not to overlap with the gate wirings 4403, but if both wirings are formed on different layers, then they can be formed overlapping through an insulating film. In this case, the area exclusively possessed by the current supply line 4408 and the gate wirings 4403 can be shared, and therefore the pixel region can be made even more high definition.

Furthermore, FIG. 18C is characterized in that the current supply line 4408 and the gate wirings 4403 are formed in parallel, similar to the structure of FIG. 18B, and in addition, two pixels are fanned with linear symmetry around the current supply line 4408. In addition, it is effective to form the current supply line 4408 so that it overlaps with one of the gate wirings 4403. In this case, the number of current supply lines can be reduced, and the pixel region can be made even more high definition.

By using the structure of the present invention, not only can the concentration of contaminating impurities within films structuring a TFT be reduced, but the contaminating impurity concentration in film interfaces can also be reduced, and therefore fluctuation of TFT characteristics can be made smaller and the TFT reliability can be increased.

What is claimed is:

1. A thin film transistor comprising:
    a base film over a substrate;
    a semiconductor film on and in contact with the base film;
    a gate insulating film on and in contact with the semiconductor film and the base film;
    a gate electrode on and in contact with the gate insulating film; and
    a source electrode and a drain electrode which are connected to the semiconductor film;
    wherein a concentration of a contaminating impurity in an interface between the semiconductor film and the gate insulating film is $2\times10^{16}$ atoms/cm$^3$ or less, and
    wherein a concentration of the contaminating impurity in an interface between the gate insulating film and the gate electrode is $2\times10^{16}$ atoms/cm$^3$ or less.

2. The thin film transistor according to claim 1, wherein a concentration of the contaminating impurity in an interface between the base film and the gate insulating film is $2\times10^{16}$ atoms/cm$^3$ or less.

3. The thin film transistor according to claim 1, wherein the contaminating impurity is at least one element selected from periodic table group 1 elements or periodic table group 2 elements.

4. The thin film transistor according to claim 1, wherein the contaminating impurity element is at least one element selected from the group consisting of Na, K, Mg, Ca and Ba.

5. The thin film transistor according to claim 1, wherein the base film comprises at least one of silicon oxide, silicon nitride and silicon oxynitride.

6. The thin film transistor according to claim 1, wherein the gate insulating film comprises at least one of silicon oxide, silicon nitride and silicon oxynitride.

7. The thin film transistor according to claim 1, wherein the semiconductor film is formed with a thickness of 10 to 100 nm.

8. The thin film transistor according to claim 1, wherein the gate electrode comprises at least one selected from the group consisting of Ta, Ti, Mo, W, WMo, TaN and WSi.

9. The thin film transistor according to claim 1, wherein the semiconductor film has crystallinity.

10. The thin film transistor according to claim 2, wherein the interface between the base film and the gate insulating film contains fluorine.

11. The thin film transistor according to claim 9, wherein an amount of hydrogen in the semiconductor film having crystallinity is 5 atom % or less.

12. The thin film transistor according to claim 9, wherein the semiconductor film having crystallinity is formed with a thickness of 10 to 100 nm.

13. A thin film transistor comprising:
    a base film over a substrate;
    a gate electrode on and in contact with the base film;
    a gate insulating film on and in contact with the base film and the gate electrode;
    a semiconductor film on and in contact with the gate insulating film; and
    a source electrode and a drain electrode which are connected to the semiconductor film,
    wherein a concentration of a contaminating impurity in an interface between the gate electrode and the gate insulating film is $2\times10^{16}$ atoms/cm$^3$ or less, and
    wherein a concentration of the contaminating impurity in an interface between the gate insulating film and the semiconductor film is $2\times10^{16}$ atoms/cm$^3$ or less.

14. The thin film transistor according to claim 13, wherein a concentration of the contaminating impurity in an interface between the base film and the gate insulating film is $2\times10^{16}$ atoms/cm$^3$ or less.

15. The thin film transistor according to claim 13, wherein the contaminating impurity is at least one element selected from periodic table group 1 elements or periodic table group 2 elements.

16. The thin film transistor according to claim 13, wherein the contaminating impurity is at least one element selected from the group consisting of Na, K, Mg, Ca and Ba.

17. The thin film transistor according to claim 13, wherein the base film comprises at least one of silicon oxide, silicon nitride and silicon oxynitride.

18. The thin film transistor according to claim 13, wherein the gate insulating film comprises at least one of silicon oxide, silicon nitride and silicon oxynitride.

19. The thin film transistor according to claim 13, wherein the semiconductor film is formed with a thickness of 10 to 100 nm.

20. The thin film transistor according to claim 13, wherein the gate electrode comprises at least one selected from the group consisting of Ta, Ti, Mo, W, WMo, TaN and WSi.

21. The thin film transistor according to claim 13, wherein the semiconductor film has crystallinity.

22. The thin film transistor according to claim 14, wherein the interface between the base film and the gate insulating film contains fluorine.

23. The thin film transistor according to claim 21, wherein an amount of hydrogen in the semiconductor film having crystallinity is 5 atom % or less.

24. The thin film transistor according to claim 21, wherein the semiconductor film having crystallinity is formed with a thickness of 10 to 100 nm.

* * * * *

UNITED STATES PATENT AND TRADEMARK OFFICE
CERTIFICATE OF CORRECTION

PATENT NO. : 8,274,083 B2  
APPLICATION NO. : 13/005728  
DATED : September 25, 2012  
INVENTOR(S) : Masaya Kadono et al.

Page 1 of 1

It is certified that error appears in the above-identified patent and that said Letters Patent is hereby corrected as shown below:

In the Specification:

Column 3, Line 53; Change "fowling" to --forming--.
Column 12, Line 9; Change "the section" to --the TFT section--.
Column 13, Line 63; Change "fowled" to --formed--.
Column 19, Line 48; Change "unit to 2205" to --unit 2205--.
Column 23, Line 18; Change "fanned" to --formed--.

In the Claims:

Column 23, Line 55, Claim 4; Change "impurity element is" to --impurity is--.

Signed and Sealed this  
Twenty-third Day of April, 2013

Teresa Stanek Rea  
*Acting Director of the United States Patent and Trademark Office*